United States Patent
Uchida et al.

(10) Patent No.: US 9,989,852 B2
(45) Date of Patent: Jun. 5, 2018

(54) POSITIVE PHOTOSENSITIVE RESIN COMPOSITION, CURED FILM FORMED BY CURING SAME, AND OPTICAL DEVICE EQUIPPED WITH SAME

(71) Applicant: TORAY INDUSTRIES, INC., Tokyo (JP)

(72) Inventors: Keiichi Uchida, Otsu (JP); Masao Kamogawa, Otsu (JP); Mitsuhito Suwa, Otsu (JP); Chika Taniguchi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days. days.

(21) Appl. No.: 14/902,411

(22) PCT Filed: Jul. 1, 2014

(86) PCT No.: PCT/JP2014/067507
§ 371 (c)(1),
(2) Date: Dec. 31, 2015

(87) PCT Pub. No.: WO2015/002183
PCT Pub. Date: Jan. 8, 2015

(65) Prior Publication Data
US 2016/0370703 A1 Dec. 22, 2016

(30) Foreign Application Priority Data
Jul. 2, 2013 (JP) ................... 2013-138754

(51) Int. Cl.
G03F 7/023 (2006.01)
G03F 7/075 (2006.01)
G03F 7/039 (2006.01)
G03F 7/22 (2006.01)
H01L 21/02 (2006.01)
H01L 27/146 (2006.01)
C08G 77/14 (2006.01)
C09D 183/06 (2006.01)
H01L 21/311 (2006.01)
G03F 7/022 (2006.01)
H01L 21/027 (2006.01)
G03F 7/004 (2006.01)

(52) U.S. Cl.
CPC .......... *G03F 7/0757* (2013.01); *C08G 77/14* (2013.01); *C09D 183/06* (2013.01); *G03F 7/0047* (2013.01); *G03F 7/022* (2013.01); *G03F 7/023* (2013.01); *G03F 7/0233* (2013.01); *G03F 7/039* (2013.01); *H01L 21/0274* (2013.01); *H01L 21/02126* (2013.01); *H01L 21/02282* (2013.01); *H01L 21/311* (2013.01); *H01L 27/1462* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 9,704,724 B2* | 7/2017 | Fujiwara | G03F 7/038 |
| 2002/0025495 A1* | 2/2002 | Ogata | G03F 7/0757 |
| | | | 430/287.1 |
| 2005/0038216 A1 | 2/2005 | Kozawa et al. | |
| 2011/0230584 A1* | 9/2011 | Araki | C08F 290/148 |
| | | | 522/99 |
| 2012/0141936 A1 | 6/2012 | Wu et al. | |
| 2012/0178022 A1* | 7/2012 | Kamogawa | G02B 1/04 |
| | | | 430/270.1 |
| 2014/0106176 A1* | 4/2014 | Albert | C09D 4/00 |
| | | | 428/447 |
| 2014/0178822 A1* | 6/2014 | Wu | G03F 7/038 |
| | | | 430/285.1 |
| 2017/0010532 A1* | 1/2017 | Iimori | G03F 7/0047 |

FOREIGN PATENT DOCUMENTS

| | | | |
|---|---|---|---|
| EP | 2360194 A1 | 8/2011 | |
| EP | 2485091 A1 | 8/2012 | |
| JP | 63-204254 | * | 8/1988 |
| JP | 01-222254 | * | 9/1989 |
| JP | 2001-081404 A | 3/2001 | |
| JP | 2003-075997 A | 3/2003 | |
| JP | 2006-293337 A | 10/2006 | |
| JP | 2006-312717 A | 11/2006 | |
| JP | 2007-246877 A | 9/2007 | |

(Continued)

OTHER PUBLICATIONS

Machine translation of JP 2001-081404 (2001).*
International Search Report dated Sep. 30, 2014, application No. PCT/JP2014/067507.
Supplementary European Search Report for Application No. 14820140.3, dated Feb. 21, 2017, 8 pages.

*Primary Examiner* — Martin J Angebranndt
(74) *Attorney, Agent, or Firm* — RatnerPrestia

(57) ABSTRACT

A positive photosensitive resin composition including: a polysiloxane synthesized by hydrolyzing and partially condensing a specific organosilane and an organosilane that has a carboxyl group and/or a dicarboxylic acid anhydride structure; particles of one or more metal compounds selected from an aluminum compound, a tin compound, a titanium compound, and a zirconium compound, or composite particles of a silicon compound and one or more metal compounds selected from an aluminum compound, a tin compound, a titanium compound, and a zirconium compound; a naphthoquinone diazide compound; and a solvent.

10 Claims, No Drawings

(56) References Cited

FOREIGN PATENT DOCUMENTS

| | | | |
|---|---|---|---|
| JP | 2008-024832 A | | 2/2008 |
| JP | 2008-107529 | * | 5/2008 |
| JP | 2008-208342 | * | 9/2008 |
| JP | 2012-123391 A | | 6/2012 |
| JP | 2012-158743 | * | 8/2013 |
| WO | WO 2011/040248 A1 | | 4/2011 |
| WO | 2012/130544 | * | 10/2012 |

* cited by examiner

POSITIVE PHOTOSENSITIVE RESIN COMPOSITION, CURED FILM FORMED BY CURING SAME, AND OPTICAL DEVICE EQUIPPED WITH SAME

CROSS REFERENCE TO RELATED APPLICATIONS

This is the U.S. National Phase application of PCT/JP2014/067507, filed Jul. 1, 2014, which claims priority to Japanese Patent Application No. 2013-138754, filed Jul. 2, 2013, the disclosures of each of these applications being incorporated herein by reference in their entireties for all purposes.

TECHNICAL FIELD OF THE INVENTION

The present invention relates to a positive photosensitive resin composition which is suitable for production of a collecting microlens requiring high transparency and high refractive index which is formed in a solid imaging device and the like, a white (transparent) color filter, and an optical waveguide which connects optical sensor parts and whose area exposed to ultraviolet-visible light is soluble in an alkaline aqueous solution.

BACKGROUND OF THE INVENTION

In recent years, with rapid development of digital cameras, camera cell-phones and the like, a smaller-sized solid imaging device and a high resolution solid imaging device are required. Since miniaturization of the solid imaging device causes deterioration of sensitivity, light is collected efficiently to prevent the deterioration of device sensitivity by locating a collecting microlens between an optical sensor part and a color filter part or above the color filter part, by forming a white (transparent) color filter at a color filter part, or by forming an optical waveguide between an optical sensor part and a color filter part. Examples of a common production method of the collecting microlens, the white (transparent) color filter, or the optical waveguide include a method of processing, by dry etching, inorganic films formed by a CVD method or the like, and a method of applying and processing a resin. The former method is hard to achieve a refractive index of 1.65 to 2.00 which is most suitable for the collecting microlens, the white (transparent) color filter or the optical waveguide, and therefore the latter method receives attention. That is, a resin composition with high refractive index is required.

Heretofore, for example, a photosensitive siloxane composition containing a polysiloxane, a quinone diazide compound, a solvent and a thermally crosslinkable compound (see e.g., Patent Document 1), and a high refractive index material obtained from a composition containing a siloxane compound having an aromatic hydrocarbon group (see e.g., Patent Document 2) are proposed. However, it has been difficult that these materials provide a cured film having adequately high refractive index.

Further, a positive photosensitive resin composition containing polyamide acid, a compound having a phenolic hydroxyl group, a quinone diazide compound and inorganic particles (e.g., Patent Document 3), and a silicone copolymer which comprises silsesquioxane having a phenol unit and a condensed polycyclic hydrocarbon group (see e.g., Patent Document 4) are proposed. However, the photosensitive resin composition and copolymer have a problem that the transparency is deteriorated since the polyamide acid or the phenolic hydroxyl group is colored.

As a material which achieves high refractive index and high transparency simultaneously are disclosed a coating composition containing an organosilane, a siloxane oligomer and fine particles and/or sol of a metal oxide (e.g., Patent Document 5), and a siloxane-based resin composition formed by copolymerizing metal oxide particles with an alkoxysilane (see e.g., Patent Document 6). Since these materials are non-photosensitive, the compositions are usually processed by a wet etching method using chemicals or a dry etching method using plasma in forming a pattern.

Further, a siloxane-based resin composition having high refractive index and high transparency due to positive photosensitivity (see e.g., Patent Document 7) is proposed.

PATENT DOCUMENTS

Patent Document 1: Japanese Patent Laid-open Publication No. 2006-293337
Patent Document 2: Japanese Patent Laid-open Publication No. 2008-24832
Patent Document 3: Japanese Patent Laid-open Publication No. 2003-75997
Patent Document 4: Japanese Patent Laid-open Publication No. 2006-312717
Patent Document 5: Japanese Patent Laid-open Publication No. 2001-81404
Patent Document 6: Japanese Patent Laid-open Publication No. 2007-246877
Patent Document 7: WO 2011/040248 A

SUMMARY OF THE INVENTION

Conventional materials of Patent Document 5 and Patent Document 6, which have achieved high refractive index and high transparency simultaneously, have problems, because formation of a pattern by an etching method is needed essentially in the case where the materials are non-photosensitive, that a process of operation is complicated and a wiring portion is deteriorated by chemicals or plasma in performing etching. Therefore, the present inventors made investigations concerning a photosensitive material. However, the material described in Patent Document 7 has been unable to maintain high sensitivity to exposure and high resolution after long-term storage at room temperature. Further, the material does not give solvent resistance to a cured film formed by low-temperature curing at 200 to 220° C. and needs essentially a high curing temperature. That is, the material has a problem of productivity. It is an object of the present invention to develop a positive photosensitive resin composition which, without compromising high refractive index and high transparency characteristics, has excellent solvent resistance and resolution after pattern formation even by curing at low temperature, and has high sensitivity to exposure and high resolution, even after long-term storage at room temperature.

In order to solve the above-mentioned problems, the present invention includes the following embodiments. That is, a positive photosensitive resin composition comprising: (a) a polysiloxane synthesised by hydrolysing and partially condensing an organosilane represented by the following general formula (1) and an organosilane that has a carboxyl group and/or a dicarboxylic acid anhydride structure; (d) particles of one or more metal compounds selected from among an aluminium compound, a tin compound, a titanium compound and a zirconium compound, or composite particles of a silicon compound and one or more metal compounds selected from among an aluminium compound, a tin compound, a titanium compound and a zirconium compound; (b) a naphthoquinone diazide compound; and (c) a solvent:

[Chemical Formula 1]

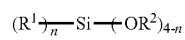
(1)

wherein $R^1$ represents hydrogen, an alkyl group with a carbon number of 1 to 10, an alkenyl group with a carbon number of 2 to 10 or an aryl group with a carbon number of 6 to 16, $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^e$s may be the same or different, respectively.

Or, a positive photosensitive resin composition comprising: (a') a polysiloxane containing metal compound-containing particles synthesised by hydrolysing and partially condensing an organosilane represented by the following general formula (1) and an organosilane that has a carboxyl group and/or a dicarboxylic acid anhydride structure in the presence of particles of one or more metal compounds selected from among an aluminium compound, a tin compound, a titanium compound and a zirconium compound, or in the presence of composite particles of a silicon compound and one or more metal compounds selected from among an aluminium compound, a tin compound, a titanium compound and a zirconium compound; (b) a naphthoquinone diazide compound; and (c) a solvent:

[Chemical Formula 2]

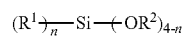
(1)

wherein $R^1$ represents hydrogen, an alkyl group with a carbon number of 1 to 10, an alkenyl group with a carbon number of 2 to 10 or an aryl group with a carbon number of 6 to 16, $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^e$s may be the same or different, respectively.

According to the photosensitive composition of the present invention, it is possible to provide a positive photosensitive resin composition capable of giving a cured film which, without compromising high refractive index and high transparency characteristics, has excellent solvent resistance and resolution after pattern formation even by curing at low temperature, and has high sensitivity to exposure, even after long-term storage at room temperature.

DETAILED DESCRIPTION OF EMBODIMENTS OF THE INVENTION

A photosensitive composition of the present invention includes a positive photosensitive resin composition comprising: (a) a polysiloxane synthesised by hydrolysing and partially condensing an organosilane represented by the following general formula (1) and an organosilane that has a carboxyl group and/or a dicarboxylic acid anhydride structure; (d) particles of one or more metal compounds selected from among an aluminium compound, a tin compound, a titanium compound and a zirconium compound, or composite particles of a silicon compound and one or more metal compounds selected from among an aluminium compound, a tin compound, a titanium compound and a zirconium compound; (b) a naphthoquinone diazide compound; and (c) a solvent:

[Chemical Formula 3]

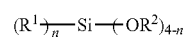
(1)

wherein $R^1$ represents hydrogen, an alkyl group with a carbon number of 1 to 10, an alkenyl group with a carbon number of 2 to 10 or an aryl group with a carbon number of 6 to 16 $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^2$s may be the same or different, respectively.

Or, a photosensitive composition of the present invention includes a positive photosensitive resin composition comprising: (a') a polysiloxane containing metal compound-containing particles synthesised by hydrolysing and partially condensing an organosilane represented by the following general formula (1) and an organosilane that has a carboxyl group and/or a dicarboxylic acid anhydride structure in the presence of particles of one or more metal compounds selected from among an aluminium compound, a tin compound, a titanium compound and a zirconium compound, or in the presence of composite particles of a silicon compound and one or more metal compounds selected from among an aluminium compound, a tin compound, a titanium compound and a zirconium compound; (b) a naphthoquinone diazide compound; and (c) a solvent:

[Chemical Formula 4]

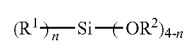
(1)

wherein $R^1$ represents hydrogen, an alkyl group with a carbon number of 1 to 10, an alkenyl group with a carbon number of 2 to 10 or an aryl group with a carbon number of 6 to 16, $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^e$s may be the same or different, respectively.

The positive photosensitive resin composition of an embodiment of the present invention contains (d) particles of one or more metal compounds selected from among an aluminium compound, a tin compound, a titanium compound and a zirconium compound, or composite particles of a silicon compound and one or more metal compounds selected from among an aluminium compound, a tin compound, a titanium compound and a zirconium compound (hereinafter, collectively referred to as metal compound-containing particles).

In an aspect of the positive photosensitive resin composition of the present invention, as described later, the positive photosensitive resin composition contains a polysiloxane containing metal compound-containing particles. Use of the polysiloxane containing metal compound-containing particles can serve to obtain a positive photosensitive resin composition having extremely excellent dispersion stability. The reason for this is probably that the polysiloxane of a matrix resin is coupled with the metal compound-containing particles. The state of the coupling can be seen by observing a boundary portion between the metal compound-containing particles and the polysiloxane by a scanning electron microscope or a transmission electron microscope. When both substances are coupled with each other, an interface between both substances is indistinct.

Examples of the metal compound-containing particles include particles of metal compounds such as oxides, sulfides or hydroxides of aluminium, tin, titanium or zirconium, and composite particles of these metal compounds and a silicon compound. The metal compound may be one type of metal compound or may be a mixture of a plurality of types of metal compounds.

Examples of the composite particles of the metal compounds and the silicon compound include silicon oxide-metal compound composite particles formed by synthesising particles of a metal compound in the presence of a silicon oxide compound, and particles of a metal compound coated with silane formed by reacting particles of a metal compound with a silane coupling agent.

Among these metal compound-containing particles, the particles of a titanium compound, particles of a zirconium compound, or composite particles of a silicon compound and a titanium compound or a zirconium compound are preferred. Further, two or more thereof may be contained. When metal compound-containing particles described above are contained, the cured film can be provided with high refractive index.

Examples of the metal compound-containing particles as commercially available inorganic particles include "OPTOLAKE TR-502" and "OPTOLAKE TR-504," which are tin oxide-titanium oxide particles, "OPTOLAKE TR-503," "OPTOLAKE TR-513," "OPTOLAKE TR-520," "OPTOLAKE TR-527," "OPTOLAKE TR-528," "OPTOLAKE TR-529," "OPTOLAKE TR-543," "OPTOLAKE TR-544," and "OPTOLAKE TR-550," which are silicon oxide-titanium oxide composite particles, and "OPTOLAKE TR-505," which is titanium oxide particles (trade names, respectively manufactured by JGC Catalysts and Chemicals Ltd.), zirconium oxide particles (manufactured by Kojundo Chemical Laboratory Co., Ltd.), tin oxide-zirconium oxide particles (manufactured by JGC Catalysts and Chemicals Ltd.), and tin oxide particles (manufactured by Kojundo Chemical Laboratory Co., Ltd.).

A number average particle size of the metal compound-containing particles is preferably 1 nm or more from the viewpoint of suppressing the occurrence of cracks in forming a thick film. Further, the number average particle size is preferably 200 nm or less, and more preferably 70 nm or less from the viewpoint of further improving the transparency of a cured film to visible light. Herein, the number average particle size of the metal compound-containing particles can be generally measured by a gas adsorption method, dynamic light scattering method, X-ray small angle scattering method or a method of directly measuring the particle size using a transmission electron microscope or scanning electron microscope, etc. However, in the present invention, the number average particle size refers to a value measured by the dynamic light scattering method. Equipment to be used is not particularly limited, and examples thereof include a dynamic light scattering photometer DLS-8000 (manufactured by Otsuka Electronics Co., Ltd.).

In the positive photosensitive composition of the present invention, the content of the metal compound-containing particles is preferably 10 parts by weight or more and 500 parts by weight or less with respect to 100 parts by weight of the total amount of the organosilane represented by the general formula (1) and the organosilane having a carboxyl group and/or a dicarboxylic acid anhydride structure. Thereby, the transmittance and refractive index of a cured film can be more improved while maintaining high sensitivity and resolution of the positive photosensitive resin composition.

The positive photosensitive resin composition of an embodiment of the present invention contains (a) a polysiloxane synthesised by hydrolysing and partially condensing an organosilane represented by the following general formula (1) and an organosilane that has a carboxyl group and/or a dicarboxylic acid anhydride structure (hereinafter, sometimes referred to as a polysiloxane).

[Chemical Formula 5]

(1)

In the above general formula (1), $R^1$ represents hydrogen, an alkyl group with a carbon number of 1 to 10, an alkenyl group with a carbon number of 2 to 10 or an aryl group with a carbon number of 6 to 16. $R^2$ represents hydrogen, an alkyl group with a carbon number of 1 to 6, an acyl group with a carbon number of 2 to 6 or an aryl group with a carbon number of 6 to 16. n represents an integer of 0 to 3. Tetrafunctional TMOS or TEOS is assumed. When n is 2 or more, $R^1$s may be the same or different, respectively. Also, when n is 2 or less, $R^e$s may be the same or different, respectively.

In an aspect of the positive photosensitive resin composition of the present invention, the positive photosensitive resin composition contains (a') a polysiloxane containing metal compound-containing particles synthesised by hydrolysing and partially condensing an organosilane represented by the following general formula (1) and an organosilane that has a carboxyl group and/or a dicarboxylic acid anhydride structure in the presence of metal compound-containing particles (hereinafter, sometimes referred to as a polysiloxane containing metal compound-containing particles (a')). Hereinafter, sometimes the polysiloxane (a) and the polysiloxane containing metal compound-containing particles (a') are collectively referred to as the polysiloxane.

[Chemical Formula 6]

(1)

In the above general formula (1), $R^1$ represents hydrogen, an alkyl group with a carbon number of 1 to 10, an alkenyl group with a carbon number of 2 to 10 or an aryl group with a carbon number of 6 to 16. $R^2$ represents hydrogen, an alkyl group with a carbon number of 1 to 6, an acyl group with a carbon number of 2 to 6 or an aryl group with a carbon number of 6 to 16. represents an integer of 0 to 3. Tetrafunctional TMOS or TEOS is assumed. When n is 2 or more $R^1$s may be the same or different, respectively. Also, when n is 2 or less, $R^e$s may be the same or different, respectively.

All of the alkyl group, the alkenyl group, the aryl group and the acyl group may be substituted, and specific examples of the substituent include hydroxy groups, alkoxy groups, epoxy groups, oxetanyl groups, fluoro groups, amino groups, mercapto groups, isocyanate groups, acryloxy groups, methacryloxy groups and carboxy groups. In addition, the numbers of carbon atoms of the alkyl group, the alkenyl group, the aryl group and the acyl group do not include the number of carbon atoms contained in the substituent. Specific examples of the alkyl group and a substitution product thereof include a methyl group, an ethyl group, an n-propyl group, an isopropyl group, an n-butyl group, a t-butyl group, an n-hexyl group, an n-decyl group, a trifluoromethyl group, a 3,3,3-trifluoropropyl group, a 3-glycidoxypropyl group, a 2-(3,4-epoxycyclohexyl)ethyl group, a [(3-ethyl-3-oxetanyl)methoxy]propyl group, a 3-aminopropyl group, a 3-mercaptopropyl group and a 3-isocyanatopropyl group. Specific examples of the alkenyl group and a substitution product thereof include a vinyl group. Specific examples of the aryl group and a substitution product thereof include a phenyl group, a tolyl group, a p-hydroxyphenyl group, and a naphthyl group, a phenanthrenyl group, a fluorenyl group, a pyrenyl group, an indenyl group and an acenaphthenyl group which are respectively a condensed polycyclic aromatic hydrocarbon group. Specific examples of the acyl group and a substitution product thereof include an acetyl group.

$R^1$ of the organosilane represented by the general formula (1) preferably contains an aryl group with a carbon number of 6 to 16 from the viewpoint of further improving the compatibility with the naphthoquinone diazide compound (b) described later.

Moreover, in the polysiloxane, the content of Si atoms coupled with $R^1$ being an aryl group is preferably 30 mol % or more, and more preferably 40 mol % or more of the total content of Si atoms originated from the organosilane. When the Si atoms coupled with $R^1$ is contained in an amount of 30 mol % or more, it is possible to suppress phase separation between the polysiloxane and the naphthoquinone diazide compound (b) in the steps of coating, drying and thermally curing during a cured film formation and form a uniform cured film with ease.

Further, it is more preferred from the viewpoint of further improving the refractive index of the cured film and the sensitivity and resolution that a part of or all of the aryl groups with a carbon number of 6 to 16 are a condensed polycyclic aromatic hydrocarbon group. That is, $R^1$ of the organosilane represented by the general formula (1) more preferably contains a condensed polycyclic aromatic hydrocarbon group. When the condensed polycyclic aromatic hydrocarbon group with a high n-electron density is contained, the cured film can be provided with high refractive index. Further, since the condensed polycyclic aromatic hydrocarbon group exerts the effect of suppressing dissolution of a non-exposed area in development by the interaction with naphthoquinone diazide, the contrast between the exposed area and the non-exposed area becomes larger. Thereby, the sensitivity can be further improved, and moreover, a reduction in resolution due to a small amount of a portion remaining without being dissolved can be suppressed. Examples of the condensed polycyclic aromatic hydrocarbon group include a naphthyl group, an anthracenyl group, a phenanthrenyl group, a fluorenyl group, a pyrenyl group, an indenyl group and an acenaphthenyl group.

In the polysiloxane, the content ratio of an organosilane, in which $R^1$ contains a condensed polycyclic aromatic hydrocarbon group, in the organosilane represented by the general formula (1), is preferably 10 mol % or more in terms of the molar ratio of Si atoms of the organosilane to the mole number of Si atoms of a whole polysiloxane derived from an organosilane. When the organosilane in which $R^1$ contains a condensed polycyclic aromatic hydrocarbon group is contained in an amount of 10 mol % or more, it is possible to more improve the sensitivity and resolution of the positive photosensitive resin composition and more improve the refractive index of the cured film. On the other hand, the content of the organosilane in which $R^1$ contains a condensed polycyclic aromatic hydrocarbon group is preferably 60 mol % or less, and more preferably 50 mol % or less from the viewpoint of suppressing a small amount of a portion remaining without being dissolved in development and further improving the resolution of the positive photosensitive resin composition.

The molar ratio of Si atoms in the organosilane represented by the general formula (1) in which $R^1$ contains a condensed polycyclic aromatic hydrocarbon group to the mole number of Si atoms of a whole polysiloxane derived from an organosilane, can be determined by measuring 29Si-NMR spectrum of a polysiloxane, and calculating the ratio between the peak area of Si coupled with a condensed polycyclic aromatic hydrocarbon group and the peak area of Si not coupled with a condensed polycyclic aromatic hydrocarbon group.

n in the general formula (1) represents an integer of 0 to 3. When n is 0, the organosilane is a tetrafunctional silane, and when n is 1, the organosilane is a trifunctional silane, and when n is 2, the organosilane is a difunctional silane, and when n is 3, the organosilane is a monofunctional silane.

Specific examples of the organosilane represented by the general formula (1) include tetra-functional silanes such as tetramethoxysilane, tetraethoxysilane, tetraacetoxysilane and tetraphenoxysilane; tri-functional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-(trimethoxysilyl)propyl succinate, 1-naphthyltrimethoxysilane, 1-naphthyltriethoxysilane, 1-naphthyltri-n-propoxysilane, 2-naphthyltrimethoxysilane, 1-anthracenyltrimethoxysilne, 9-anthracenyltrimethoxysilne, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane and 5-acenaphthenyltrimethoxysilane; di-functional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane and di(1-naphthyl)diethoxysilane; and mono-functional silanes such as trimethylmethoxysilane, tri-n-butylethoxysilane, (3-glycidoxypropyl)dimethylmethoxysilane and (3-glycidoxypropyl)dimethylethoxysilane. Two or more of these organosilanes may be used in combination.

Among these organosilanes, a tri-functional silane is preferably used from the viewpoint of improving the hydrolysable property and condensation reactivity at the time of polysiloxane synthesis to further improve the crack resistance and hardness of the cured film. Moreover, 1-naphthyltrimethoxysilane, 1-naphthyltriethoxysilane, 1-naphthyl-tri-n-propoxysilane, 2-naphthyltrimethoxysilane, 1-anthracenyltrimethoxysilne, 9-anthracenyltrimethoxysilne, 9-phenanthrenyltrimethoxysilane, 9-fluorenyltrimethoxysilane, 2-fluorenyltrimethoxysilane, 2-fluorenonyl trimethoxysilane, 1-pyrenyltrimethoxysilane, 2-indenyltrimethoxysilane, 5-acenaphthenyltrimethoxysilane and the like, in which each of $R^1$s is a condensed polycyclic aromatic hydrocarbon group, are preferred.

The polysiloxane in the positive photosensitive composition of an embodiment of the present invention is synthesised by hydrolysing and partially condensing an organosilane having a carboxyl group and/or a dicarboxylic acid anhydride structure. By having the carboxyl group in the polysiloxane, alkali-solubility (developing property) is improved, and therefore it become possible to suppress development residue and maintain high sensitivity to exposure and high resolution even after long-term storage at room temperature.

In the positive photosensitive resin composition of an embodiment of the present invention, the content ratio of the organosilane having a carboxyl group and/or a dicarboxylic acid anhydride structure is 5 mol % or more and 30 mol % or less in terms of the molar ratio of Si atoms of the organosilane to the mole number of Si atoms of a whole polysiloxane derived from an organosilane. When the content ratio is in this range, the positive photosensitive resin composition has good solvent resistance, and a film which has high sensitivity and high resolution even after long-term storage at room temperature, can be obtained.

The content of the carboxyl group in the polysiloxane can be determined, for example, by measuring 29Si-nuclear magnetic resonance spectrum of a polysiloxane, and calculating the ratio between the peak area of Si coupled with the carboxyl group and the peak area of Si not coupled with the carboxyl group. When the carboxyl group is not directly coupled with Si, the content of the carboxyl group of the whole polysiloxane is calculated from a ratio of an integration of a peak derived from the carboxyl group to an integration of a peak of other groups excluding a silanol group from 1H-nuclear magnetic resonance spectrum, and from the calculated content and the result of the 29Si-nuclear magnetic resonance spectrum previously described, the content of the carboxyl group indirectly coupled is calculated. As another method, the content of the carboxyl group can also be calculated by calculating a ratio of the carboxyl group to the silanol group from the 1H-nuclear magnetic resonance spectrum, and then measuring an acid number.

The organosilane compound constituting the polysiloxane and having a carboxyl group and/or a dicarboxylic acid anhydride structure will be specifically described.

Examples of the organosilane compound having a carboxyl group include urea group-containing organosilane compounds represented by the following general formula (5) or urethane group-containing organosilane compounds represented by the following general formula (6). Two or more of these organosilane compounds may be used in combination.

[Chemical Formula 7]

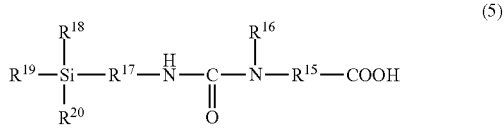

(5)

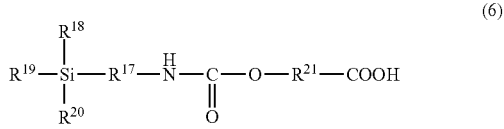

(6)

In the above formulas, $R^{15}$, $R^{17}$ and $R^{21}$ represent a divalent organic group with a carbon number of 1 to 20, respectively. $R^{16}$ represents a hydrogen atom or an alkyl group with a carbon number of 1 to 3. $R^{18}$ to $R^{20}$ may be the same or different, and represent an alkyl group with a carbon number of 1 to 6, an alkoxy group with a carbon number of 1 to 6, a phenyl group, a phenoxy group, an alkylcarbonyloxy group with a carbon number of 2 to 6, or a substitution product thereof. However, at least one of $R^{18}$ to $R^{20}$ is an alkoxy group, a phenoxy group or an acetoxy group.

Preferred examples of the $R^{15}$ to $R^{21}$ in the general formulas (5) and (6) include hydrocarbon groups such as a methylene group, an ethylene group, an n-propylene group, an n-butylene group, a phenylene group, —$CH_2$—$C_6H_4$—$CH_2$—, and —$CH_2$—$C_6H_4$—. Among these, hydrocarbon groups having an aromatic ring such as a phenylene group, —$CH_2$—$C_6H_4$—$CH_2$—, and —$CH_2$—$C_6H_4$— are preferred from the viewpoint of heat resistance.

The $R^{16}$ in the general formula (5) is preferably hydrogen or a methyl group from the viewpoint of reactivity.

Specific examples of the $R^{17}$ in the general formulas (5) and (6) include hydrocarbon groups such as a methylene group, an ethylene group, an n-propylene group, an n-butylene group, an n-pentylene group; an oxymethylene group, an oxyethylene group, an oxy-n-propylene group, an oxy-n-butylene group, and an oxy-n-pentylene group. Among these, a methylene group, an ethylene group, an n-propylene group, an n-butylene group, an oxymethylene group, an oxyethylene group, an oxy-n-propylene group, and an oxy-n-butylene group are preferred from the viewpoint of ease of synthesis.

Specific examples of the alkyl groups of the $R^{18}$ to $R^{20}$ in the general formulas (5) and (6) include a methyl group, an ethyl group, an n-propyl group and an isopropyl group. A methyl group or an ethyl group is preferred from the viewpoint of ease of synthesis. Specific examples of the alkoxy group include a methoxy group, an ethoxy group, an n-propoxy group and an isopropoxy group. A methoxy group or an ethoxy group is preferred from the viewpoint of ease of synthesis. Examples of a substituent of the substitution product include a methoxy group and an ethoxy group. Specific example thereof include a 1-methoxypropyl group and a methoxyethoxy group.

The urea group-containing organosilane compound represented by the general formula (5) can be prepared by a publicly known urea-forming reaction of an aminocarboxylic compound represented by the following general formula (7) and an isocyanate group-containing organosilane compound represented by the following general formula (9). Further, the urethane group-containing organosilane compound represented by the general formula (6) can be prepared by a publicly known urethanization reaction of a hydroxycarboxylic compound represented by the following general formula (8) and an isocyanate group-containing organosilane compound represented by the following general formula (9).

[Chemical Formula 8]

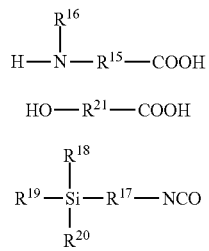

(7)

(8)

(9)

In the above formulas, $R^{15}$, $R^{17}$ and $R^{21}$ represent a divalent organic group with a carbon number of 1 to 20, respectively. $R^{16}$ represents a hydrogen atom or an alkyl group with a carbon number of 1 to 3. $R^{18}$ to $R^{20}$ represent an alkyl group with a carbon number of 1 to 6, an alkoxy group with a carbon number of 1 to 6, a phenyl group, a phenoxy group, an alkylcarbonyloxy group with a carbon number of 2 to 6, or a substitution product thereof. However, at least one of $R^{18}$ to $R^{20}$ is an alkoxy group, a phenoxy group or an acetoxy group. Preferred examples of the $R^{15}$ to $R^{21}$ are as previously described for the $R^{15}$ to $R^{21}$ in the general formulas (5) and (6).

Other specific examples of the organosilane compound having a carboxyl group include compounds represented by the general formula (10).

[Chemical Formula 9]

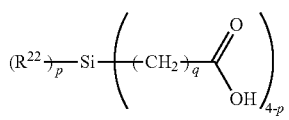

(10)

In the above formula, $R^{22}$ represents an alkyl group with a carbon number of 1 to 6, an alkoxy group with a carbon number of 1 to 6, a phenyl group, a phenoxy group, an alkylcarbonyloxy group with a carbon number of 2 to 6, or a substitution product thereof. However, $R^{22}$s may be the same or different, respectively, and at least one of $R^{22}$ is an alkoxy group, a phenoxy group or an acetoxy group. p represents an integer of 1 to 3. q represents an integer of 2 to 20.

Specific examples of the organosilane compound having a dicarboxylic acid anhydride structure includes organosilane compounds represented by any one of the following general formulas (2) to (4). Two or more of these organosilane compounds may be used in combination.

[Chemical Formula 10]

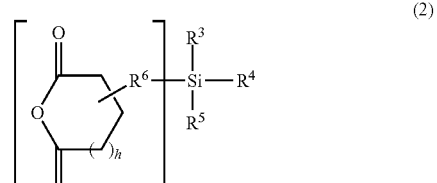

(2)

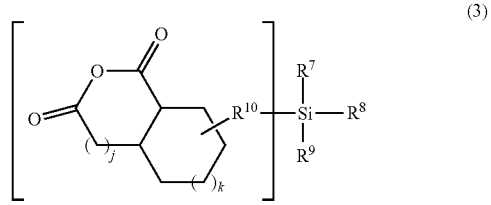

(3)

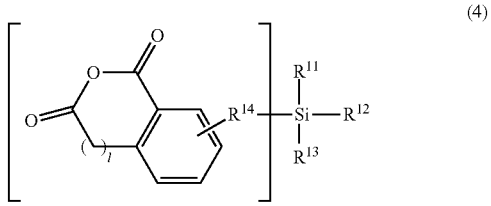

(4)

In the above general formulas (2) to (4), $R^3$ to $R^5$, $R^7$ to $R^9$, and $R^{11}$ to $R^{13}$ represent an alkyl group with a carbon number of 1 to 6, an alkoxy group with a carbon number of 1 to 6, a phenyl group, a phenoxy group, or an alkylcarbonyloxy group with a carbon number of 2 to 6. $R^6$, $R^{10}$ and $R^{14}$ represent a chain aliphatic hydrocarbon group of a single bond or with a carbon number of 1 to 10, a cyclic aliphatic hydrocarbon group with a carbon number of 3 to 16, an alkylcarbonyloxy group with a carbon number of 2 to 6, a carbonyl group, an ether group, an ester group, an amide group, an aromatic group with a carbon number of 6 to 16, or a divalent group having any one thereof. For a hydrogen atom of these groups, an alkyl group with a carbon number of 1 to 10, an alkenyl group with a carbon number of 2 to 10, an aryl group with a carbon number of 6 to 16, an alkylcarbonyloxy group with a carbon number of 2 to 6, a hydroxy group, an amino group, a carboxyl group or a thiol group may be substituted. h, j, k and i represent an integer of 0 to 3.

Specific examples of $R^6$, $R^{10}$ and $R^{14}$ include $C_2H_4$—, —$C_3H_6$—, —$C_4H_8$—, —O—, —$C_3H_6OCH_2CH(OH)CH_2O_2C$—, —CO—, —$CO_2$—, —CONH—, and organic groups described below.

[Chemical Formula 11]

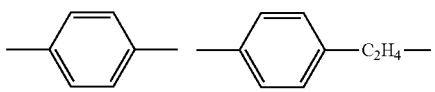

-continued

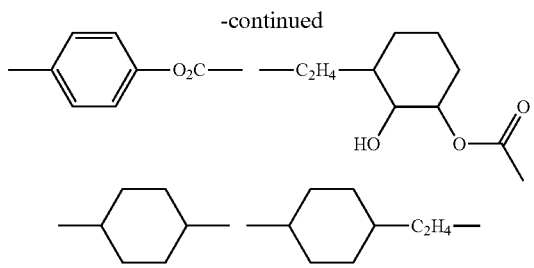

Specific examples of the organosilane compound represented by the general formula (2) include 3-(trimethoxysilyl)propyl succinic anhydride, 3-(triethoxysilyl)propyl succinic anhydride, and 3-(triphenoxysilyl)propyl succinic anhydride. Specific examples of the organosilane compound represented by the general formula (3) include 3-(trimethoxysilyl)propyl cyclohexyl dicarboxylic anhydride. Specific examples of the organosilane compound represented by the general formula (4) include 3-(trimethoxysilyl)propyl phthalic anhydride.

The polysiloxane in an embodiment of the present invention is synthesised by hydrolysing and partially condensing an organosilane represented by the general formula (1) and a monomer such as an organosilane having a carboxyl group and/or a dicarboxylic acid anhydride structure. Herein, partial condensing means that Si—OH of a hydrolysate is not entirely condensed but a part of Si—OH remains in the resulting polysiloxane. It is common that Si—OH partially remains in a common condensation condition described later, and in the present invention, the amount of Si—OH remaining is not limited. Another organosilane may be further used in addition to the organosilanes having the general formula (1) and a carboxyl group and/or a dicarboxylic acid anhydride structure. A common method can be employed for hydrolysing or partial condensing. Examples of the method include a method in which a solvent, water, and a catalyst as required are added to an organosilane mixture and the resulting mixture is heated and stirred at a temperature of 50 to 150° C. for 0.5 to 100 hours. A hydrolysis by-product (alcohol such as methanol) or a condensation by-product (water) may be removed by distillation during stirring, as required.

The above-mentioned reaction solvent is not particularly limited, and a solvent similar to the solvent (c) described later is usually used. The additive amount of the solvent is preferably 10 to 1500 parts by weight with respect to 100 parts by weight of a monomer such as an organosilane. Further, the additive amount of water used for a hydrolysis reaction is preferably 0.5 to 5 moles per 1 mole of a hydrolysable group.

The catalyst to be added as required is not particularly limited, and an acid catalyst or a base catalyst is preferably used. Specific examples of the acid catalyst include hydrochloric acid, nitric acid, sulfuric acid, hydrofluoric acid, phosphoric acid, acetic acid, trifluoroacetic acid, formic acid, polycarboxylic acids and anhydrides thereof, and ion exchange resins. Specific examples of the base catalyst include triethylamine, tripropylamine, tributylamine, tripentylamine, trihexylamine, triheptylamine, trioctylamine, diethylamine, triethanolamine, diethanolamine, sodium hydroxide, potassium hydroxide, alkoxysilanes having an amino group and ion exchange resins. The additive amount of the catalyst is preferably 0.01 to 10 parts by weight with respect to 100 parts by weight of a monomer such as an organosilane.

Further, it is preferred from the viewpoint of the storage stability of a composition that the polysiloxane solution after hydrolysing and partially condensing does not contain the above-mentioned catalyst, and the catalyst can be removed as required. The method for removing the catalyst is not particularly limited; however, washing with water and/or a process of using an ion exchange resin is preferred in point of ease of operation and a removal ability. Washing with water is a method in which the polysiloxane solution is diluted with an appropriate hydrophobic solvent and is washed with water several times, and the resulting organic layer is concentrated using an evaporator or the like. The process of using an ion exchange resin refers to a method in which the polysiloxane solution is brought into contact with an appropriate ion exchange resin.

The positive photosensitive composition of an embodiment of the present invention contains a naphthoquinone diazide compound (b). When the positive photosensitive composition contains the naphthoquinone diazide compound, it exhibits positive photosensitivity in which an exposed area is eliminated by a developer. As the naphthoquinone diazide compound, a compound having a phenolic hydroxyl group bonded to naphthoquinonediazidesulfonic acid through ester linkage is preferred.

Specific examples of the compound having a phenolic hydroxyl group include the following compounds (all available as ones manufactured by Honshu Chemical Industry Co., Ltd.).

[Chemical Formula 12]

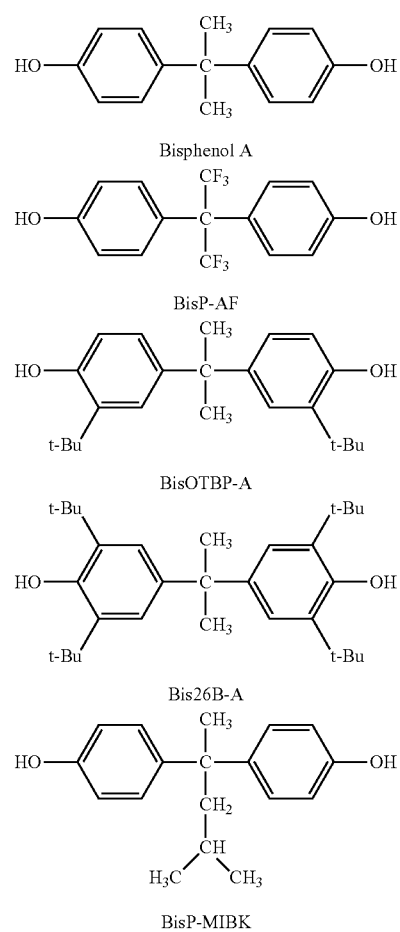

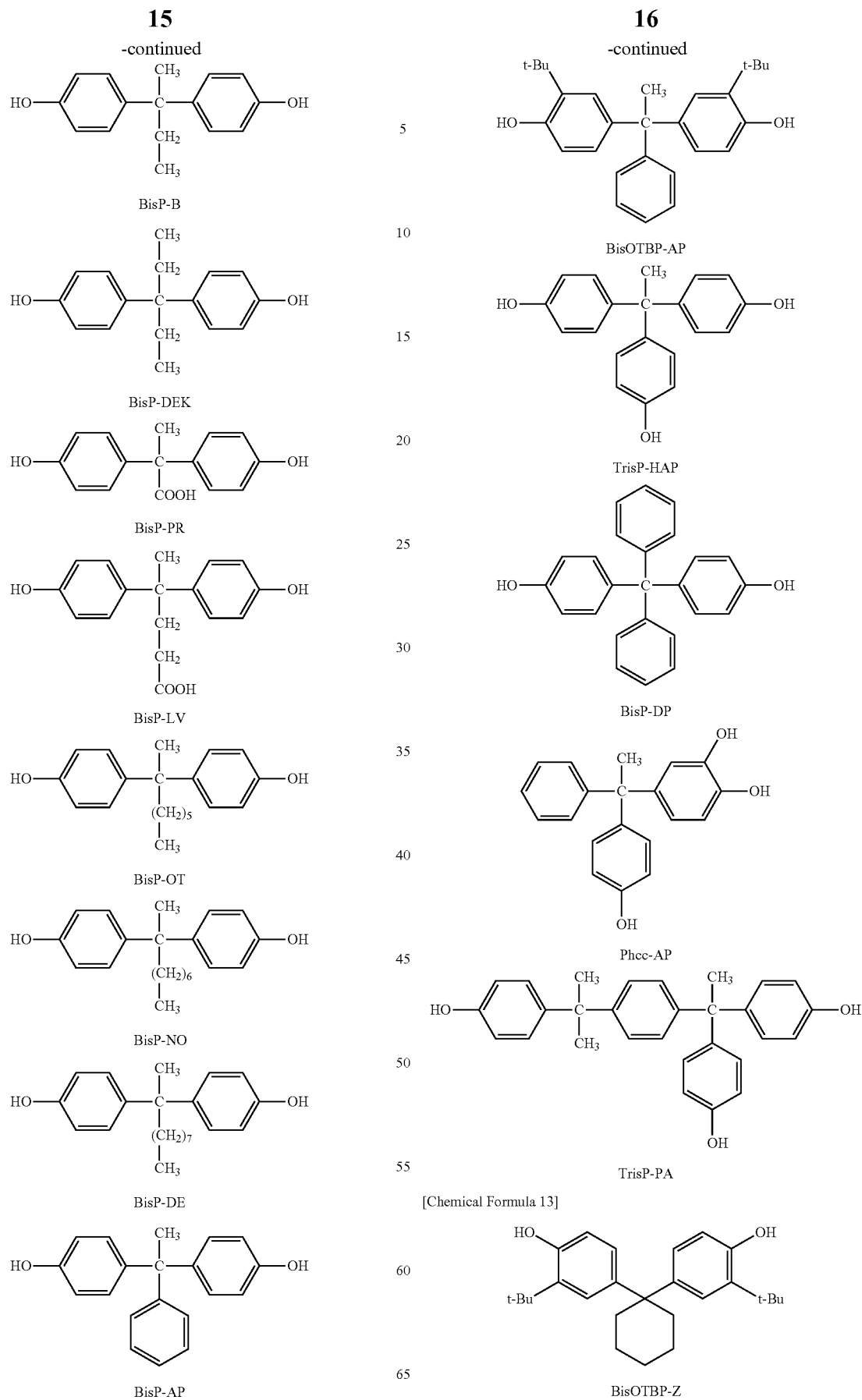

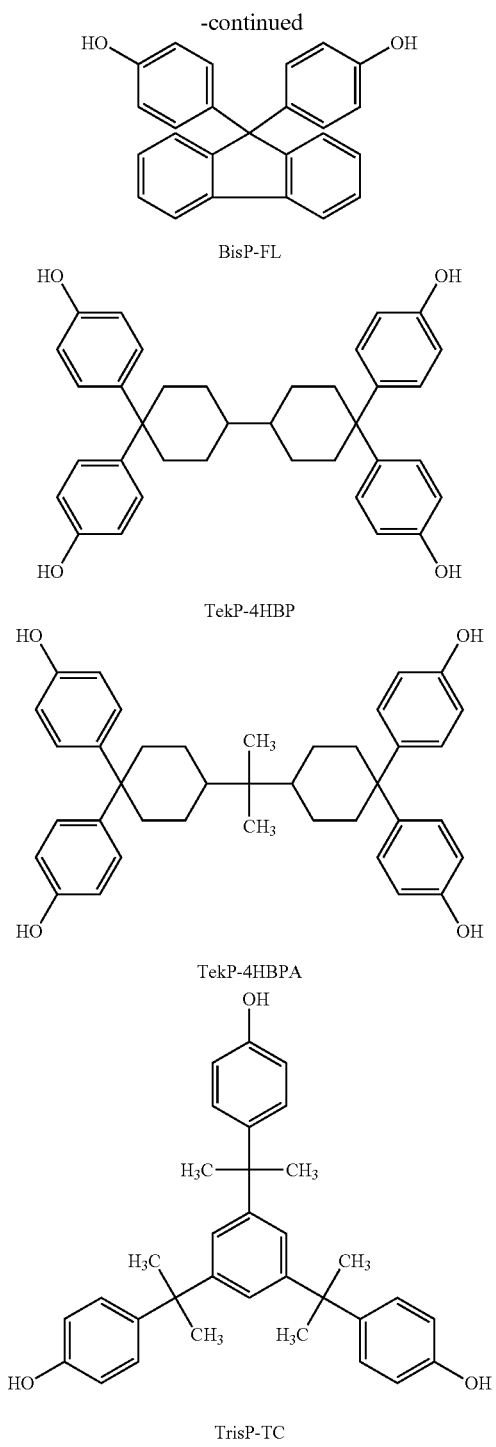

in a wide range of wavelengths since it has an absorption band in a wide range of wavelength region. It is preferred to select the 4-naphthoquinonediazidesulfonic ester compound or the 5-naphthoquinonediazidesulfonic ester compound depending on the wavelength used for exposure. The 4-naphthoquinonediazidesulfonic ester compound and the 5-naphthoquinonediazidesulfonic ester compound can be used in combination.

The content of the naphthoquinone diazide compound (b) in the positive photosensitive resin composition of the present invention, is not particularly limited, and it is preferably 1 part by weight or more, and more preferably 3 parts by weight or more with respect to 100 parts by weight of the total of the polysiloxane (a) and the metal compound-containing particles, or with respect to 100 parts by weight of the polysiloxane containing metal compound-containing particles (a'). Further, the content is preferably 30 parts by weight or less, and more preferably 20 parts by weight or less from the viewpoint of suppressing a reduction in compatibility with a polysiloxane or coloring due to decomposition in thermally curing and from the viewpoint of further improving the transparency of the positive photosensitive resin composition or cured film.

The positive photosensitive resin composition of an embodiment of the present invention contains a solvent (c). The solvent is not particularly limited; however, a compound having an alcoholic hydroxyl group is preferred. When the solvent having an alcoholic hydroxyl group is used, the solubility of a polysiloxane in a quinone diazide compound (b) can be improved, and the transparency of a coating film prepared from the positive photosensitive resin composition can be further improved.

The solvent having an alcoholic hydroxyl group is not particularly limited; however, a compound having a boiling point of 110 to 250° C. at atmospheric pressure is preferred. When the boiling point of the solvent is 110° C. or higher, drying in forming the coating film proceeds so moderately that a coating film having good surface appearance can be easily attained. On the other hand, when the boiling point of the solvent is 250° C. or lower, the solvent remaining in the film can be easily removed.

Specific examples of the solvent having an alcoholic hydroxyl group include acetol (boiling point: 147° C.), 3-hydroxy-3-methyl-2-butanone (boiling point: 140° C.), 4-hydroxy-3-methyl-2-butanone (boiling point: 73° C.), 5-hydroxy-2-pentanone (boiling point: 144° C.), 4-hydroxy-4-methyl-2-pentanone (diacetone alcohol) (boiling point: 166° C.), ethyl lactate (boiling point: 151° C.), butyl lactate (boiling point: 186° C.), propylene glycol monomethyl ether (boiling point: 118° C.), propylene glycol monoethyl ether (boiling point: 132° C.), propylene glycol mono-n-propyl ether (boiling point: about 150° C.), propylene glycol mono-n-butyl ether (boiling point: 170° C.), diethylene glycol monomethyl ether (boiling point: 194° C.), diethylene glycol monoethyl ether (boiling point: 202° C.), dipropylene glycol monomethyl ether (boiling point: about 190° C.), 3-methoxy-1-butanol (boiling point: 161° C.) and 3-methyl-3-methoxy-1-butanol (boiling point: 174° C.). Two or more thereof may be contained.

Further, the positive photosensitive resin composition of the present invention may contain other solvents together with the above-mentioned solvents or in place of the above-mentioned solvents. Examples of the other solvents include esters such as ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate and ethyl acetoacetate;

The naphthoquinone diazide compound can be synthesised by a publicly known esterification reaction between a compound having a phenolic hydroxyl group and naphthoquinonediazidesulfonic acid chloride. As the naphthoquinonediazidesulfonic acid chloride serving as a raw material, 4-naphthoquinonediazidesulfonic acid chloride or 5-naphthoquinonediazidesulfonic acid chloride can be used. A 4-naphthoquinonediazidesulfonic ester compound is suitable for i-line exposure since it has an absorption band at an i-line (wavelength 365 nm) region. Further, a 5-naphthoquinonediazidesulfonic ester compound is suitable for exposure ketones such as methyl isobutyl ketone, diisopropyl ketone, diisobutyl ketone and acetylacetone; ethers such as diethyl ether, diisopropyl ether, di-n-butyl ether, diphenyl ether, diethylene glycol ethylmethyl ether and diethylene glycol dimethyl ether; γ-butyrolactone, γ-valerolactone, δ-valerolactone, propylene carbonate, N-methylpyrrolidone, cyclopentanone, cyclohexanone, and cycloheptanone.

The content of the solvent (c) in the positive photosensitive resin composition of the present invention is not particularly limited, and it is preferably in the range of 100 to 2000 parts by weight with respect to 100 parts by weight of the total of the polysiloxane (a) and the metal compound-containing particles, or with respect to 100 parts by weight of the polysiloxane containing metal compound-containing particles (a').

The positive photosensitive resin composition of the present invention may contain various surfactants such as various fluorine-based surfactants and silicone-based surfactants in order to improve a flowing property at the time of application. The type of surfactants is not particularly limited, and for example, fluorine-based surfactants such as "Megafac (registered trademark)" F142D, Megafac F172, Megafac F173, Megafac F183, Megafac F445, Megafac F470, Megafac F475, Megafac F477 (respectively manufactured by Dainippon Ink and Chemicals, Inc.), NBX-15, FTX-218 and DFX-18 (respectively manufactured by NEOS Co., Ltd.); silicone-based surfactants such as BYK-333, BYK-301, BYK-331, BYK-345 and BYK-307 (respectively manufactured by BYK Japan KK); polyalkylene oxide-based surfactants and poly(meth)acrylate-based surfactants can be used. Two or more of these surfactants may be used in combination.

Moreover, the positive photosensitive resin composition of the present invention, as required, may contain additives such as a silane coupling agent, a crosslinking agent, a crosslinking promoter, a sensitizer, a thermal radical generating agent, a solubility enhancer, a dissolution inhibitor, a stabilizer and an antifoaming agent.

Next, embodiments of a method of curing the positive photosensitive resin composition of the present invention to obtain a cured film will be described by way of examples.

The positive photosensitive resin composition of the present invention is applied onto a substrate by a publicly known method such as spin coating or slit coating, and heated (prebaked) using a heating apparatus such as a hot plate or oven. Prebaking is preferably carried out in a temperature range from 50 to 150° C. for 30 seconds to 30 minutes. A prebaked film thickness is preferably 0.1 to 15 μm.

After completion of prebaking, pattern exposure is performed at about 10 to about 4000 J/m$^2$ (on the exposure amount at a wavelength 365 nm equivalent basis) through a desired mask using an ultraviolet-visible exposure machine such as a stepper, mirror projection mask aligner (MPA) or parallel light mask aligner (PLA).

After completion of exposure, the exposed area is dissolved and removed by development to obtain a positive pattern. The resolution of the pattern is preferably 8 μm or less. As the developing method, it is preferred to immerse the exposed film in a developer for 5 seconds to 10 minutes by a method such as showering, dipping or paddling. As the developer, a publicly known alkaline developer can be used, and examples of the developer include aqueous solutions of inorganic alkalis such as alkali metal hydroxides, carbonates, phosphates, silicates and borates; amines such as 2-diethylaminoethanol, monoethanolamine and diethanolamine; and quaternary ammonium salts such as tetramethylammonium hydroxide (TMAH) and choline. Two or more of these developers may be used in combination. Further, after completion of development, it is preferred to rinse using water, and if necessary, a heating apparatus such as a hot plate or oven may be used for dehydrating, drying and baking in a temperature range from 50 to 150° C.

Thereafter, the entire film surface of the developed film is preferably exposed (bleaching exposure) at about 100 to 20000 J/m$^2$ (on the exposure amount at a wavelength 365 nm equivalent basis) using an ultraviolet-visible exposure machine such as PLA. When bleaching exposure is performed, an unreactive naphthoquinone diazide compound remaining in the developed film can be photo-decomposed to further improve the transparency of the resulting cured film.

The film subjected to bleaching exposure, if necessary, is heated (soft-baked) in a temperature range from 50 to 250° C. for 30 seconds to 30 minutes using a heating apparatus such as a hot plate or oven, and is heated, i.e., cured, in a temperature range from 150 to 450° C. for about 30 seconds to 2 hours using a heating apparatus such as a hot plate or oven to form a cured film.

The positive photosensitive resin composition of the present invention preferably has a sensitivity of 1500 J/m$^2$ or less at the time of exposure, and more preferably a sensitivity of 1000 J/m$^2$ or less from the viewpoint of productivity in forming a pattern. Such high sensitivity can be easily attained by a positive photosensitive resin composition containing the polysiloxane including, for example, an organosilane having a carboxyl group and/or a dicarboxylic acid anhydride structure.

The sensitivity at the time of exposure is determined by the following method. The positive photosensitive resin composition is applied onto a silicon wafer by spin coating at an arbitrary rotating speed using a spin coater and then prebaked at 120° C. for 3 minutes by use of a hotplate to prepare a prebaked film with a film thickness of 1 μm. The prebaked film is subjected to exposure through a gray scale mask for sensitivity measurement which has a 1 to 10 μm line and space pattern by an ultra high pressure mercury lamp using a PLA (PLA-501F manufactured by Canon Inc.), then developed with a shower of 2.38 wt % TMAH aqueous solution for 60 seconds using an automatic developing machine (AD-2000 manufactured by Takizawa Sangyo Co., Ltd.), and then rinsed with water for 30 seconds. In the formed pattern, the exposure amount at which a 10 μm line and space pattern is resolved at a width ratio of 1:1 is determined as the sensitivity.

Further, the positive photosensitive resin composition of the present invention preferably has a resolution after curing of 10 μm or less, and more preferably a resolution after curing of 5 μm or less for fine hole-pattern formation. Such resolution can be easily attained by a positive photosensitive resin composition containing the polysiloxane including, for example, an organosilane having a carboxyl group and/or a dicarboxylic acid anhydride structure.

The resolution after curing is determined by the following method. By the same method as that of determining the sensitivity in exposure described above, the exposure amount at which a 10 μm line and space pattern is resolved at a width ratio of 1:1 is determined as the sensitivity. Thereafter, the positive photosensitive resin composition is cured at 220° C. for 5 minutes using a hot plate to prepare a cured film, and thereby, a minimum pattern size at the sensitivity is determined as the resolution after curing.

A cured film formed by curing the positive photosensitive resin composition of the present invention preferably has a light transmittance per 1 μm thickness of 90% or more at a wavelength of 400 nm, and more preferably has the light transmittance of 92% or more. Such a high transmittance can be easily achieved, for example, by a positive photosensitive resin composition including, for example, polysiloxane with high transparency as a resin component.

The light transmittance per 1 μm thickness of the cured film at a wavelength of 400 nm is determined by the following method. The positive photosensitive resin composition is applied onto a TEMPAX Float glass plate by spin coating at an arbitrary rotating speed using a spin coater and then prebaked at 100° C. for 3 minutes by use of a hot plate. Thereafter, as bleaching exposure, the entire film surface is exposed to an ultra high pressure mercury lamp at 5000 J/m$^2$ (on the exposure amount at a wavelength 365 nm equivalent basis) using a PLA, and then, a hot plate is used for thermally curing at 220° C. for 5 minutes in the air to prepare a cured film having a thickness of 1 μm. The ultraviolet-visible absorption spectrum of the obtained cured film is measured using MultiSpec-1500 manufactured by Shimadzu Corp., and the light transmittance at a wavelength of 400 nm is determined. As another method, the light transmittance can be determined by measuring an extinction factor of an objective cured film by each wavelength and a film thickness by using a spectroscopic ellipsometer FE 5000 manufactured by Otsuka Electronics Co., Ltd. and substituting the measurements into the following equation.

Light transmittance=$\exp(-4\pi kt/\lambda)$

In the above equation, k represents an extinction factor, t represents a film thickness, and λ represents a measured film thickness.

The positive photosensitive resin composition and the cured film of the present invention are suitably used for optical devices such as solid imaging devices, optical filters and displays. More specific examples thereof include a collecting microlens formed in a solid imaging device, a white (transparent) color filter and an optical waveguide, an anti-reflection film installed as an optical filter, a planarizing material of a TFT substrate for a display, a color filter and its protective film of a liquid crystal display and the like, and a phase shifter. Among these, the positive photosensitive resin composition and the cured film of the present invention are particularly suitably used for a collecting microlens formed in a solid imaging device and an optical waveguide which connects the white (transparent) color filter or the collecting microlens to an optical sensor part since it can achieve high transparency and high refractive index simultaneously. The positive photosensitive resin composition and the cured film can also be used as a buffer coat, an interlayer insulation film and various protective films of a semiconductor device. In the positive photosensitive resin composition of the present invention, work can be simplified and the degradation of a wiring portion due to an etching liquid or plasma can be avoided since pattern formation by an etching process is unnecessary.

EXAMPLES

Hereinafter, the present invention will be described in more detail by way of examples, but the present invention is not limited to these examples. Compounds, for which an abbreviation is used, of the compounds used in Synthesis examples and Examples are shown below.
PGMEA: propylene glycol monomethyl ether acetate
DAA: diacetone alcohol A solid concentration of the polysiloxane solution was determined by the following method. A polysiloxane solution in an amount of 1.5 g was weighed out in an aluminium cup and heated at 250° C. for 30 minutes using a hot plate to evaporate a liquid. A solid content left in the aluminium cup after heating was weighed out to determine a solid concentration of the polysiloxane solution.

Synthesis Example 1 Synthesis of Carboxyl Group-Containing Silane Compound (A)

Into a 300 mL eggplant flask, 23.23 g of p-aminobenzoic acid and 209.05 g of propylene glycol monomethyl ether acetate (PGMEA) were charged, and the resulting mixture was stirred at room temperature for 30 minutes to dissolve p-aminobenzoic acid. Into the resulting solution, 46.53 g of isocyanatopropyltriethoxysilane and 1.19 g of dibutyltin dilaurate were charged, and the resulting mixture was stirred for 1 hour in an oil bath at 70° C. Thereafter, the reactant was cooled to room temperature in the air, and a precipitated solid was collected by filtration by use of a glass filter and dried to obtain a carboxyl group-containing silane compound (A). The yield of the silane compound was 46.7 g.

Synthesis Example 2 Synthesis of Carboxyl Group-Containing Silane Compound (B)

Into a 300 mL eggplant flask, 23.39 g of p-hydroxybenzoic acid and 210.5 g of PGMEA were charged, and the resulting mixture was stirred at room temperature for 30 minutes to dissolve p-hydroxybenzoic acid. Into the resulting solution, 46.53 g of isocyanatopropyltriethoxysilane and 1.19 g of dibutyltin dilaurate were charged, and the resulting mixture was stirred for 3 hours in an oil bath at 40° C. Thereafter, the reactant was cooled to room temperature in the air, and a precipitated solid was collected by filtration by use of a glass filter and dried to obtain a carboxyl group-containing silane compound (B). The yield of the silane compound was 42.4 g.

Synthesis Example 3 Synthesis of Polysiloxane Containing Metal Compound-Containing Particles Solution (PS-1)

Into a 500 mL three-necked flask, 8.17 g (0.06 mole) of methyltrimethoxysilane, 19.83 g (0.10 mole) of phenyltrimethoxysilane, 15.37 g (0.04 mole) of a carboxyl group-containing silane compound (A), 147.03 g (the content of particles was 100 parts by weight with respect to 100 parts by weight of weight (30.29 g) in the case where an organosilane is completely condensed) of "OPTOLAKE" TR-550 (trade name, manufactured by JGC Catalysts and Chemicals Ltd., number average particle size: 15 nm), which was a 20.6 wt % methanol dispersion of composite particles of titanium oxide and silicon oxide, and 112.50 g of DAA were charged, and a phosphoric acid aqueous solution formed by dissolving 0.217 g (0.50 wt % with respect to the charged monomers) of phosphoric acid in 11.52 g of water was added over 10 minutes while the mixture was stirred at room temperature. The number average particle size was measured by the dynamic light scattering method using the dynamic light scattering photometer DLS-8000 (manufactured by Otsuka Electronics Co., Ltd.). Thereafter, the flask was immersed in an oil bath at 40° C. and stirred for 60 minutes, and then a temperature of the oil bath was raised to 115° C. over 30 minutes. An internal temperature of the solution reached 100° C. 1 hour after start of the temperature rise, and the solution was heated and stirred for the next 2 hours (internal temperature was 100 to 110° C.) to obtain a polysiloxane solution (PS-1). In addition, nitrogen gas was flown at 0.05 l/min during increasing the temperature and heating/stirring the solution. Methanol and water, by-products, were distilled in a total amount of 127.21 g during a reaction. The solid content of the resulting polysiloxane containing metal compound-containing particles solution (PS-1) was 33 wt %.

Synthesis Example 4 Synthesis of Polysiloxane Containing Metal Compound-Containing Particles Solution (PS-2)

Into a 500 mL three-necked flask, 8.17 g (0.06 mole) of methyltrimethoxysilane, 19.83 g (0.10 mole) of phenyltrimethoxysilane, 15.41 g (0.04 mole) of a carboxyl group-containing silane compound (B), 147.23 g (the content of particles was 100 parts by weight with respect to 100 parts by weight of weight (30.33 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 112.65 g of DAA were charged, and a phosphoric acid aqueous solution formed by dissolving 0.217 g (0.50 wt % with respect to the charged monomers) of phosphoric acid in 11.52 g of water was added over 10 minutes while the mixture was stirred at room temperature. Thereafter, the resulting mixture was heated and stirred in the same manner as in Synthesis example 3 to obtain a polysiloxane solution (PS-2). Methanol and water, by-products, were distilled in a total amount of 127.35 g during a reaction. The solid content of the resulting polysiloxane containing metal compound-containing particles solution (PS-2) was 34 wt %.

Synthesis Example 5 Synthesis of Polysiloxane Containing Metal Compound-Containing Particles Solution (PS-3)

Into a 500 mL three-necked flask, 8.17 g (0.06 mole) of methyltrimethoxysilane, 19.83 g (0.10 mole) of phenyltrimethoxysilane, 8.32 g (0.04 mole) of 4-trimethoxysilylbutanoic acid, 112.84 g (the content of particles was 100 parts by weight with respect to 100 parts by weight of weight (23.25 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 86.34 g of DAA were charged, and a phosphoric acid aqueous solution formed by dissolving 0.182 g (0.50 wt % with respect to the charged monomers) of phosphoric acid in 11.52 g of water was added over 10 minutes while the mixture was stirred at room temperature. Thereafter, the resulting mixture was heated and stirred in the same manner as in Synthesis example 3 to obtain a polysiloxane solution (PS-3). Methanol and water, by-products, were distilled in a total amount of 102.78 g during a reaction. The solid content of the resulting polysiloxane containing metal compound-containing particles solution (PS-3) was 35 wt %.

Synthesis Example 6 Synthesis of Polysiloxane Containing Metal Compound-Containing Particles Solution (PS-4)

Into a 500 mL three-necked flask, 8.17 g (0.06 mole) of methyltrimethoxysilane, 19.83 g (0.10 mole) of phenyltrimethoxysilane, 10.49 g (0.04 mole) of 3-(trimethoxysilyl)propyl succinate, 123.37 g (the content of particles was 100 parts by weight with respect to 100 parts by weight of weight (25.42 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 94.40 g of DAA were charged, and a phosphoric acid aqueous solution formed by dissolving 0.192 g (0.50 wt % with respect to the charged monomers) of phosphoric acid in 11.52 g of water was added over 10 minutes while the mixture was stirred at room temperature. Thereafter, the resulting mixture was heated and stirred in the same manner as in Synthesis example 3 to obtain a polysiloxane solution (PS-4). Methanol and water, by-products, were distilled in a total amount of 110.30 g during a reaction. The solid content of the resulting polysiloxane containing metal compound-containing particles solution (PS-4) was 33 wt %.

Synthesis Example 7 Synthesis of Polysiloxane Containing Metal Compound-Containing Particles Solution (PS-5)

Into a 500 mL three-necked flask, 12.26 g (0.09 mole) of methyltrimethoxysilane, 19.83 g (0.10 mole) of phenyltrimethoxysilane, 2.62 g (0.01 mole) of 3-(trimethoxysilyl)propyl succinate, 102.38 g (the content of particles was 100 parts by weight with respect to 100 parts by weight of weight (21.09 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 78.34 g of DAA were charged, and a phosphoric acid aqueous solution formed by dissolving 0.174 g (0.50 wt % with respect to the charged monomers) of phosphoric acid in 10.98 g of water was added over 10 minutes while the mixture was stirred at room temperature. Thereafter, the resulting mixture was heated and stirred in the same manner as in Synthesis example 3 to obtain a polysiloxane solution (PS-5). Methanol and water, by-products, were distilled in a total amount of 95.30 g during a reaction. The solid content of the resulting polysiloxane containing metal compound-containing particles solution (PS-5) was 33 wt %.

Synthesis Example 8 Synthesis of Polysiloxane Containing Metal Compound-Containing Particles Solution (PS-6)

Into a 500 mL three-necked flask, 10.90 g (0.08 mole) of methyltrimethoxysilane, 19.83 g (0.10 mole) of phenyltrimethoxysilane, 5.25 g (0.02 mole) of 3-(trimethoxysilyl)propyl succinate, 109.38 g (the content of particles was 100 parts by weight with respect to 100 parts by weight of weight (22.53 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 83.69 g of DAA were charged, and a phosphoric acid aqueous solution formed by dissolving 0.180 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-6). Methanol and water, by-products, were distilled in a total amount of 100.30 g during a reaction. The solid content of the resulting polysiloxane containing metal compound-containing particles solution (PS-6) was 33 wt %.

Synthesis Example 9 Synthesis of Polysiloxane Containing Metal Compound-Containing Particles Solution (PS-7)

Into a 500 mL three-necked flask, 5.45 g (0.04 mole) of methyltrimethoxysilane, 19.83 g (0.10 mole) of phenyltrimethoxysilane, 15.74 g (0.06 mole) of 3-(trimethoxysilyl)propyl succinate, 137.37 g (the content of particles was 100 parts by weight with respect to 100 parts by weight of weight (28.30 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 105.11 g of DAA were charged, and a phosphoric acid aqueous solution formed by dissolving 0.205 g (0.50 wt % with respect to the charged monomers) of phosphoric acid in 11.88 g of water was added over 10 minutes while the mixture was stirred at room temperature. Thereafter, the resulting mixture was heated and stirred in the same manner as in Synthesis example 3 to obtain a polysiloxane solution (PS-7). Methanol and water, by-products, were distilled in a total amount of 120.30 g during a reaction. The solid content of the resulting polysiloxane containing metal compound-containing particles solution (PS-7) was 33 wt %.

Synthesis Example 10 Synthesis of Polysiloxane Containing Metal Compound-Containing Particles Solution (PS-8)

Into a 500 mL three-necked flask, 17.71 g (0.13 mole) of methyltrimethoxysilane, 9.92 g (0.05 mole) of phenyltrimethoxysilane, 5.25 g (0.02 mole) of 3-(trimethoxysilyl)propyl succinate, 94.31 g (the content of particles was 100 parts by weight with respect to 100 parts by weight of weight (19.43 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 72.16 g of DAA were charged, and a phosphoric acid aqueous solution formed by dissolving 0.164 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-8). Methanol and water, by-products, were distilled in a total amount of 89.53 g during a reaction. The solid content of the resulting polysiloxane containing metal compound-containing particles solution (PS-8) was 33 wt %.

Synthesis Example 11 Synthesis of Polysiloxane Containing Metal Compound-Containing Particles Solution (PS-9)

Into a 500 mL three-necked flask, 13.62 g (0.10 mole) of methyltrimethoxysilane, 15.86 g (0.08 mole) of phenyltrimethoxysilane, 5.25 g (0.02 mole) of 3-(trimethoxysilyl)propyl succinate, 103.35 g (the content of particles was 100 parts by weight with respect to 100 parts by weight of weight (21.29 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 79.08 g of DAA were charged, and a phosphoric acid aqueous solution formed by dissolving 0.174 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-9). Methanol and water, by-products, were distilled in a total amount of 96.00 g during a reaction. The solid content of the resulting polysiloxane containing metal compound-containing particles solution (PS-9) was 33 wt %.

Synthesis Example 12 Synthesis of Polysiloxane Containing Metal Compound-Containing Particles Solution (PS-10)

Into a 500 mL three-necked flask, 27.76 g (0.14 mole) of phenyltrimethoxysilane, 15.74 g (0.06 mole) of 3-(trimethoxysilyl)propyl succinate, 149.43 g (the content of particles was 100 parts by weight with respect to 100 parts by weight of weight (30.78 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 114.33 g of DAA were charged, and a phosphoric acid aqueous solution formed by dissolving 0.218 g (0.50 wt % with respect to the charged monomers) of phosphoric acid in 11.88 g of water was added over 10 minutes while the mixture was stirred at room temperature. Thereafter, the resulting mixture was heated and stirred in the same manner as in Synthesis example 3 to obtain a polysiloxane solution (PS-10). Methanol and water, by-products, were distilled in a total amount of 128.92 g during a reaction. The solid content of the resulting polysiloxane containing metal compound-containing particles solution (PS-10) was 33 wt %.

Synthesis Example 13 Synthesis of Polysiloxane Containing Metal Compound-Containing Particles Solution (PS-11)

Into a 500 mL three-necked flask, 21.79 g (0.16 mole) of methyltrimethoxysilane, 39.66 g (0.20 mole) of phenyltrimethoxysilane, 10.49 g (0.04 mole) of 3-(trimethoxysilyl)propyl succinate, 109.38 g (the content of particles was 50 parts by weight with respect to 100 parts by weight of weight (45.07 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 125.54 g of DAA were charged, and a phosphoric acid aqueous solution formed by dissolving 0.360 g (0.50 wt % with respect to the charged monomers) of phosphoric acid in 22.32 g of water was added over 10 minutes while the mixture was stirred at room temperature. Thereafter, the resulting mixture was heated and stirred in the same manner as in Synthesis example 3 to obtain a polysiloxane solution (PS-11). Methanol and water, by-products, were distilled in a total amount of 122.44 g during a reaction. The solid content of the resulting polysiloxane containing metal compound-containing particles solution (PS-11) was 34 wt %.

Synthesis Example 14 Synthesis of Polysiloxane Containing Metal Compound-Containing Particles Solution (PS-12)

Into a 500 mL three-necked flask, 10.90 g (0.08 mole) of methyltrimethoxysilane, 19.83 g (0.10 mole) of phenyltrimethoxysilane, 5.25 g (0.02 mole) of 3-(trimethoxysilyl)propyl succinate, 218.76 g (the content of particles was 200 parts by weight with respect to 100 parts by weight of weight (22.53 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 125.54 g of DAA were charged, and a phosphoric acid aqueous solution formed by dissolving 0.180 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-12). Methanol and water, by-products, were distilled in a total amount of 178.47 g during a reaction. The solid content of the resulting polysiloxane containing metal compound-containing particles solution (PS-12) was 33 wt %.

Synthesis Example 15 Synthesis of Polysiloxane Containing Metal Compound-Containing Particles Solution (PS-13)

Into a 500 mL three-necked flask, 5.45 g (0.04 mole) of methyltrimethoxysilane, 9.92 g (0.05 mole) of phenyltrimethoxysilane, 2.62 g (0.01 mole) of 3-(trimethoxysilyl)propyl succinate, 218.76 g (the content of particles was 100 parts by weight with respect to 100 parts by weight of weight (22.53 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 104.62 g of DAA were charged, and a phosphoric acid aqueous solution formed by dissolving 0.090 g (0.50 wt % with respect to the charged monomers) of phosphoric acid in 5.58 g of water was added over 10 minutes while the mixture was stirred at room temperature. Thereafter, the resulting mixture was heated and stirred in the same manner as in Synthesis example 3 to obtain a polysiloxane solution (PS-13). Methanol and water, by-products, were distilled in a total amount of 167.40 g during a reaction. The solid content of the resulting polysiloxane containing metal compound-containing particles solution (PS-13) was 33 wt %.

Synthesis Example 16 Synthesis of Polysiloxane Containing Metal Compound-Containing Particles Solution (PS-14)

Into a 500 mL three-necked flask, 10.90 g (0.08 mole) of methyltrimethoxysilane, 15.86 g (0.08 mole) of phenyltrimethoxysilane, 5.25 g (0.02 mole) of 3-(trimethoxysilyl)propyl succinate, 4.97 g (0.02 mol) of 1-naphthyltrimethoxysilane, 114.24 g (the content of particles was 400 parts by weight with respect to 100 parts by weight of weight (22.53 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 87.41 g of DAA were charged, and a phosphoric acid aqueous solution formed by dissolving 0.185 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-14). Methanol and water, by-products, were distilled in a total amount of 103.78 g during a reaction. The solid content of the resulting polysiloxane containing metal compound-containing particles solution (PS-14) was 33 wt %.

Synthesis Example 17 Synthesis of Polysiloxane Containing Metal Compound-Containing Particles Solution (PS-15)

Into a 500 mL three-necked flask, 10.90 g (0.08 mole) of methyltrimethoxysilane, 9.92 g (0.05 mole) of phenyltrimethoxysilane, 5.25 g (0.02 mole) of 3-(trimethoxysilyl)propyl succinate, 12.42 g (0.05 mole) of 1-naphthyltrimethoxysilane, 121.53 g (the content of particles was 100 parts by weight with respect to 100 parts by weight of weight (25.04 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 92.99 g of DAA were charged, and a phosphoric acid aqueous solution formed by dissolving 0.192 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-15). Methanol and water, by-products, were distilled in a total amount of 108.99 g during a reaction. The solid content of the resulting polysiloxane containing metal compound-containing particles solution (PS-15) was 33 wt %.

Synthesis Example 18 Synthesis of Polysiloxane Containing Metal Compound-Containing Particles Solution (PS-16)

Into a 500 mL three-necked flask, 10.90 g (0.08 mole) of methyltrimethoxysilane, 5.25 g (0.02 mole) of 3-(trimethoxysilyl)propyl succinate, 24.84 g (0.10 mole) of 1-naphthyltrimethoxysilane, 121.53 g (the content of particles was 100 parts by weight with respect to 100 parts by weight of weight (25.04 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 102.28 g of DAA were charged, and a phosphoric acid aqueous solution formed by dissolving 0.205 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-16). Methanol and water, by-products, were distilled in a total amount of 117.67 g during a reaction. The solid content of the resulting polysiloxane containing metal compound-containing particles solution (PS-16) was 33 wt %.

Synthesis Example 19 Synthesis of Polysiloxane Containing Metal Compound-Containing Particles Solution (PS-17)

Into a 500 mL three-necked flask, 5.45 g (0.04 mole) of methyltrimethoxysilane, 5.25 g (0.02 mole) of 3-(trimethoxysilyl)propyl succinate, 34.77 g (0.14 mole) of 1-naphthyltrimethoxysilane, 155.45 g (the content of particles was 100 parts by weight with respect to 100 parts by weight of weight (32.02 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 118.94 g of DAA were charged, and a phosphoric acid aqueous solution formed by dissolving 0.227 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-17). Methanol and water, by-products, were distilled in a total amount of 133.23 g during a reaction. The solid content of the resulting polysiloxane containing metal compound-containing particles solution (PS-17) was 33 wt %.

Synthesis Example 20 Synthesis of Polysiloxane Containing Metal Compound-Containing Particles Solution (PS-18)

Into a 500 mL three-necked flask, 19.07 g (0.14 mole) of methyltrimethoxysilane, 5.25 g (0.02 mole) of 3-(trimethoxysilyl)propyl succinate, 9.93 g (0.04 mole) of 1-naphthyltrimethoxysilane, 101.01 g (the content of particles was 100 parts by weight with respect to 100 parts by weight of weight (20.81 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 77.29 g of DAA were charged, and a phosphoric acid aqueous solution formed by dissolving 0.171 g (0.50 wt % with respect to the charged monomers) of phosphoric acid in 11.16 g of water was added over 10 minutes while the mixture was stirred at room temperature. Thereafter, the resulting mixture was heated and stirred in the same manner as in Synthesis example 3 to obtain a polysiloxane solution (PS-18). Methanol and water, by-products, were distilled in a total amount of 94.32 g during a reaction. The solid content of the resulting polysiloxane containing metal compound-containing particles solution (PS-18) was 33 wt %.

Synthesis Example 21 Synthesis of Polysiloxane Containing Metal Compound-Containing Particles Solution (PS-19)

Into a 500 mL three-necked flask, 13.62 g (0.10 mole) of methyltrimethoxysilane, 19.83 g (0.10 mole) of phenyltrimethoxysilane, 95.39 g (the content of particles was 100 parts by weight with respect to 100 parts by weight of weight (19.65 g) in the case where an organosilane is completely condensed) of "OPTOLAKE" TR-550 (trade name, manufactured by JGC Catalysts and Chemicals Ltd.), which was a 20.6 wt % methanol dispersion of composite particles of titanium oxide and silicon oxide, and 72.99 g of DAA were charged, and a phosphoric acid aqueous solution formed by dissolving 0.167 g (0.50 wt % with respect to the charged monomers) of phosphoric acid in 10.80 g of water was added over 10 minutes while the mixture was stirred at room temperature. Thereafter, the resulting mixture was heated and stirred in the same manner as in Synthesis example 3 to obtain a polysiloxane solution (PS-19). Methanol and water, by-products, were distilled in a total amount of 90.30 g during a reaction. The solid content of the resulting polysiloxane containing metal compound-containing particles solution (PS-19) was 34 wt %.

Synthesis Example 22 Synthesis of Polysiloxane Solution (PS-20)

Into a 500 mL three-necked flask, 27.24 g (0.20 mole) of methyltrimethoxysilane, 49.58 g (0.25 mole) of phenyltrimethoxysilane, 13.12 g (0.05 mole) of 3-(trimethoxysilyl)propyl succinate, and 104.62 g of DAA were charged, and a phosphoric acid aqueous solution formed by dissolving 0.450 g (0.50 wt % with respect to the charged monomers) of phosphoric acid in 27.90 g of water was added over 10 minutes while the mixture was stirred at room temperature. Thereafter, the resulting mixture was heated and stirred in the same manner as in Synthesis example 3 to obtain a polysiloxane solution (PS-20). Methanol and water, by-products, were distilled in a total amount of 55.35 g during a reaction. The solid content of the resulting polysiloxane containing metal compound-containing particles solution (PS-20) was 34 wt %.

Synthesis Example 23 Synthesis of Polysiloxane Solution (PS-21)

Into a 500 mL three-necked flask, 27.24 g (0.20 mole) of methyltrimethoxysilane, 49.58 g (0.25 mole) of phenyltrimethoxysilane, 12.32 g (0.05 mole) of 2-(3,4-epoxycyclohexyl)ethyltrimethoxysilane, and 101.47 g of DAA were charged, and a phosphoric acid aqueous solution formed by dissolving 0.446 g (0.50 wt % with respect to the charged monomers) of phosphoric acid in 27.00 g of water was added over 10 minutes while the mixture was stirred at room temperature. Thereafter, the resulting mixture was heated and stirred in the same manner as in Synthesis example 3 to obtain a polysiloxane solution (PS-21). Methanol and water, by-products, were distilled in a total amount of 55.35 g during a reaction. The solid content of the resulting polysiloxane containing metal compound-containing particles solution (PS-21) was 33 wt %.

The composition of Synthesis examples 3 to 23 are collectively shown in Tables 1 and 2.

TABLE 1

|  |  | Content of metal compound particles (Part by weight of solid content with respect to 100 of polysiloxane) | Composition ratio of organosilane compound in polysiloxane component |  |  |
|---|---|---|---|---|---|
|  |  |  | Organosilane having carboxyl group and/or dicarboxylic acid anhydride structure (molar ratio) | Others (molar ratio) | |
| Synthesis example 3 | Polysiloxane containing metal compound particles solution (PS-1) | TR-550 (100 parts by weight) | carboxyl group-containing silane compound (A) (20) | methyltrimethoxy silane (30) | phenyltrimethoxy silane (50) |

TABLE 1-continued

|  |  | Content of metal compound particles (Part by weight of solid content with respect to 100 of polysiloxane) | Composition ratio of organosilane compound in polysiloxane component |  |  |
|---|---|---|---|---|---|
|  |  |  | Organosilane having carboxyl group and/or dicarboxylic acid anhydride structure (molar ratio) | Others (molar ratio) | |
| Synthesis example 4 | Polysiloxane containing metal compound particles solution (PS-2) | TR-550 (100 parts by weight) | carboxyl group-containing silane compound (B) (20) | methyltrimethoxy silane (30) | phenyltrimethoxy silane (50) |
| Synthesis example 5 | Polysiloxane containing metal compound particles solution (PS-3) | TR-550 (100 parts by weight) | 4-trimethoxysilyl butanoic acid (20) | methyltrimethoxy silane (30) | phenyltrimethoxy silane (50) |
| Synthesis example 6 | Polysiloxane containing metal compound particles solution (PS-4) | TR-550 (100 parts by weight) | 3-(trimethoxysilyl)propyl succinate (20) | methyltrimethoxy silane (30) | phenyltrimethoxy silane (50) |
| Synthesis example 7 | Polysiloxane containing metal compound particles solution (PS-5) | TR-550 (100 parts by weight) | 3-(trimethoxysilyl)propyl succinate (5) | methyltrimethoxy silane (45) | phenyltrimethoxy silane (50) |
| Synthesis example 8 | Polysiloxane containing metal compound particles solution (PS-6) | TR-550 (100 parts by weight) | 3-(trimethoxysilyl)propyl succinate (10) | methyltrimethoxy silane (40) | phenyltrimethoxy silane (50) |
| Synthesis example 9 | Polysiloxane containing metal compound particles solution (PS-7) | TR-550 (100 parts by weight) | 3-(trimethoxysilyl)propyl succinate (30) | methyltrimethoxy silane (20) | phenyltrimethoxy silane (50) |
| Synthesis example 10 | Polysiloxane containing metal compound particles solution (PS-8) | TR-550 (100 parts by weight) | 3-(trimethoxysilyl)propyl succinate (10) | methyltrimethoxy silane (65) | phenyltrimethoxy silane (25) |
| Synthesis example 11 | Polysiloxane containing metal compound particles solution (PS-9) | TR-550 (100 parts by weight) | 3-(trimethoxysilyl)propyl succinate (10) | methyltrimethoxy silane (50) | phenyltrimethoxy silane (40) |
| Synthesis example 12 | Polysiloxane containing metal compound particles solution (PS-10) | TR-550 (100 parts by weight) | 3-(trimethoxysilyl)propyl succinate (30) | — | phenyltrimethoxy silane (70) |
| Synthesis example 13 | Polysiloxane containing metal compound particles solution (PS-11) | TR-550 (50 parts by weight) | 3-(trimethoxysilyl)propyl succinate (10) | methyltrimethoxy silane (40) | phenyltrimethoxy silane (50) |

TABLE 2

| | | Content of metal compound particles (Part by weight of solid content with respect to 100 of polysiloxane) | Composition ratio of organosilane compound in polysiloxane component | | | |
|---|---|---|---|---|---|---|
| | | | Organosilane having carboxyl group and/or dicarboxylic acid anhydride structure (molar ratio) | Others (molar ratio) | | |
| Synthesis example 14 | Polysiloxane containing metal compound particles solution (PS-12) | TR-550 (200 parts by weight) | 3-(trimethoxysilyl)propyl succinate (10) | methyltrimethoxy silane (40) | phenyltrimethoxy silane (50) | |
| Synthesis example 15 | Polysiloxane containing metal compound particles solution (PS-13) | TR-550 (400 parts by weight) | 3-(trimethoxysilyl)propyl succinate (10) | methyltrimethoxy silane (40) | phenyltrimethoxy silane (50) | |
| Synthesis example 16 | Polysiloxane containing metal compound particles solution (PS-14) | TR-550 (100 parts by weight) | 3-(trimethoxysilyl)propyl succinate (10) | methyltrimethoxy silane (40) | phenyltrimethoxy silane (40) | 1-naphthyl trimethoxysilane (10) |
| Synthesis example 17 | Polysiloxane containing metal compound particles solution (PS-15) | TR-550 (100 parts by weight) | 3-(trimethoxysilyl)propyl succinate (10) | methyltrimethoxy silane (40) | phenyltrimethoxy silane (25) | 1-naphthyl trimethoxysilane (25) |
| Synthesis example 18 | Polysiloxane containing metal compound particles solution (PS-16) | TR-550 (100 parts by weight) | 3-(trimethoxysilyl)propyl succinate (10) | methyltrimethoxy silane (40) | — | 1-naphthyl trimethoxysilane (50) |
| Synthesis example 19 | Polysiloxane containing metal compound particles solution (PS-17) | TR-550 (100 parts by weight) | 3-(trimethoxysilyl)propyl succinate (10) | methyltrimethoxy silane (20) | — | 1-naphthyl trimethoxysilane (70) |
| Synthesis example 20 | Polysiloxane containing metal compound particles solution (PS-18) | TR-550 (100 parts by weight) | 3-(trimethoxysilyl)propyl succinate (10) | methyltrimethoxy silane (70) | — | 1-naphthyl trimethoxysilane (20) |
| Synthesis example 21 | Polysiloxane containing metal compound particles solution (PS-19) | TR-550 (100 parts by weight) | — | methyltrimethoxy silane (50) | phenyltrimethoxy silane (50) | |
| Synthesis example 22 | Polysiloxane solution (PS-20) | — | 3-(trimethoxysilyl)propyl succinate (10) | methyltrimethoxy silane (40) | phenyltrimethoxy silane (50) | |
| Synthesis example 23 | Polysiloxane solution (PS-21) | — | — | methyltrimethoxy silane (40) | phenyltrimethoxy silane (50) | 2-(3,4-epoxycyclohexyl)ethyl trimethoxysilane (10) |

Synthesis Example 24 Synthesis of Naphthoquinone Diazide Compound (QD-1)

In a dry nitrogen flow, 15.32 g (0.05 mole) of Ph-cc-AP-MF (trade name, manufactured by Honshu Chemical Industry Co., Ltd.) and 37.62 g (0.14 mole) of 5-naphthoquinone diazide sulfonic acid chloride were dissolved in 450 g of 1,4-dioxane, and the solution was kept at room temperature. To this solution, 15.58 g (0.154 mole) of triethylamine mixed with 50 g of 1,4-dioxane was added dropwise while the system was kept at a temperature of lower than 35° C. After completion of dropwise addition, the resulting mixture was stirred at 30° C. for 2 hours. A triethylamine salt was filtered, and filtrate was charged into water. Thereafter, the precipitate was collected by filtration. The precipitate was dried in a vacuum dryer to obtain a quinone diazide compound (QD-1) having the following structure.

[Chemical Formula 14]

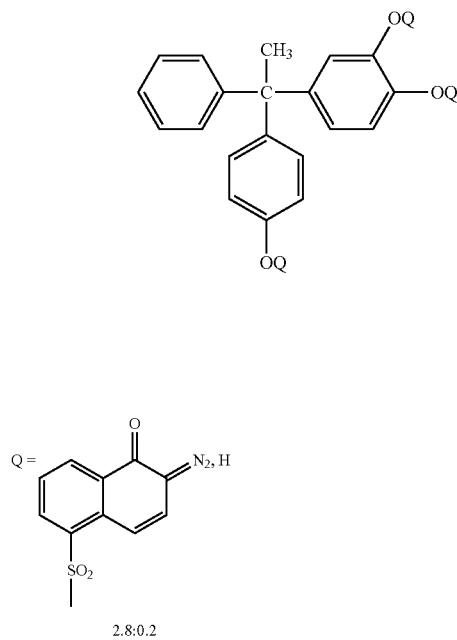

Synthesis Example 25 Synthesis of Naphthoquinone Diazide Compound (QD-2)

In a dry nitrogen flow, 15.32 g (0.05 mole) of TrisP-HAP (trade name, manufactured by Honshu Chemical Industry Co., Ltd.) and 22.84 g (0.085 mole) of 5-naphthoquinone diazide sulfonic acid chloride were dissolved in 450 g of 1,4-dioxane, and the solution was kept at room temperature. To this solution, 9.46 g (0.0935 mole) of triethylamine mixed with 50 g of 1,4-dioxane was added dropwise while the system was kept at a temperature of lower than 35° C. After completion of dropwise addition, the resulting mixture was stirred at 30° C. for 2 hours. A triethylamine salt was filtered, and filtrate was charged into water. Thereafter, the precipitate was collected by filtration. The precipitate was dried in a vacuum dryer to obtain a quinone diazide compound (QD-2) having the following structure.

[Chemical Formula 15]

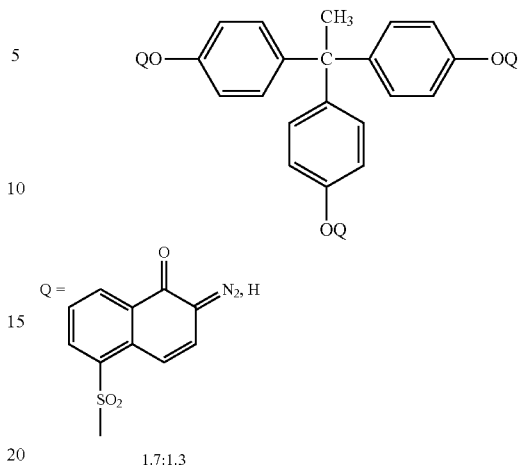

Photosensitive properties and cured film properties of the composition in each of Examples and Comparative examples were evaluated by the following methods. A silicon wafer substrate was used for the following evaluations (1) to (5) and (7) and a TEMPAX Float glass substrate was used for the following evaluation (6).

(1) Measurement of Film Thickness

Using Lambda-Ace STM-602 (trade name, manufactured by Dainippon Screen Mfg. Co., Ltd.), thicknesses of a prebaked film and a cured film were measured at a refractive index of 1.70.

(2) Determination of Normalized Remaining Film Thickness

The normalized remaining film thickness was calculated from the following equation.

Normalized remaining film thickness (%)=(Film thickness of non-exposed area after development)/(Film thickness of prebaked film)×100

(3) Determination of Photosensitivity

The exposure amount at which a 10 μm line and space pattern is formed at a width ratio of 1:1 after development (hereinafter, referred to as an optimum exposure amount) was taken as the photosensitivity, and the photosensitivity of a cured film (on a 6-inch silicon wafer) prepared immediately after preparing the composition and a cured film (on a 6-inch silicon wafer) prepared after storing the composition at room temperature for 1 month were measured.

(4) Determination of Resolution

The minimum pattern size at the optimum exposure amount after development was referred to as a resolution after development and the minimum pattern size at the optimum exposure amount after curing was referred to as a resolution after curing, and the resolutions of a cured film (on a 6-inch silicon wafer) prepared immediately after preparing the composition and a cured film (on a 6-inch silicon wafer) prepared after storing the composition at room temperature for 1 month were measured.

(5) Determination of Refractive Index

The cured film formed on the 6-inch silicon wafer was used to measure the refractive index at 22° C. at a wavelength of 550 nm and a film thickness using a spectroscopic ellipsometer FE5000 manufactured by Otsuka Electronics Co., Ltd.

(6) Measurement of Light Transmittance

First, only a TEMPAX Float glass substrate was measured using MultiSpec-1500 (trade name, manufactured by Shimadzu Corp.), and the ultraviolet-visible absorption spectrum thereof was employed as a reference. Next, a cured film of the composition was formed on the TEMPAX Float glass substrate so as to have a film thickness of about 1 μm (pattern exposure was not performed), and this sample was measured with a single beam to determine a light transmittance at a wavelength of 400 nm which is converted to a light transmittance per 1 μm thickness by a Lambert law, and the difference between the light transmittance and the reference was taken as the light transmittance of the cured film.

(7) Evaluation of Solvent Resistance

The cured film formed on the 6-inch silicon wafer was immersed in a PGMEA solvent at 25° C. for 2 minutes, and it is determined that the solvent resistance is good if the normalized remaining film thickness in the immersion is 99% or more. The normalized remaining film thickness was calculated from the following equation.

Normalized remaining film thickness (%)=Film thickness after immersion in PGMEA solvent/Film thickness before immersion in PGMEA solvent×100

Example 1

The polysiloxane solution (PS-1) (69.49 g) obtained in Synthesis example 3, the quinone diazide compound (QD-1) (2.06 g) obtained in Synthesis example 24, DFX-18 (fluorine-based surfactant, manufactured by NEOS CO., LTD.) (100 ppm), DAA (13.44 g), and PGMEA (14.70 g) were mixed and stirred under a yellow lamp to form a uniform solution, and then filtrated with a filter with a pore size of 0.20 μm to prepare a composition 1.

Immediately after the preparation, the composition 1 was applied onto a 6-inch silicon wafer by spin coating using a spin coater (1H-360S manufactured by Mikasa Co., Ltd.) and then heated at 100° C. for 3 minutes by use of a hot plate (SCW-636 manufactured by Dainippon Screen Mfg. Co., Ltd.) to prepare a prebaked film with a thickness of 1.0 μm. The prebaked film was subjected to pattern exposure through a gray scale mask for sensitivity measurement by an ultra high pressure mercury lamp using a PLA (parallel light mask aligner) (PLA-501F manufactured by Canon Inc.), and developed with a shower of a 2.38 wt % tetramethylammonium hydroxide (TMAH) aqueous solution for 90 seconds using an automatic developing machine (AD-2000 manufactured by Takizawa Sangyo Co., Ltd.), and then rinsed with water for 30 seconds. Thereafter, as bleaching exposure, the entire surface of the film was exposed to an ultra high pressure mercury lamp at 5000 J/m$^2$ (on the exposure amount at wavelength 365 nm equivalent basis) using the PLA (PLA-501F manufactured by Canon Inc.). Thereafter, the exposed film was cured at 220° C. for 5 minutes by use of a hot plate to prepare a cured film (on a 6-inch silicon wafer).

Further, a cured film (on a 6-inch silicon wafer) was prepared in the same manner as in the above-mentioned cured film except for using, as the composition 1, a composition which was stored at room temperature for 1 month.

Further, a cured film (on a TEMPAX Float glass substrate) was prepared in the same manner as in the above-mentioned cured film except for applying the composition 1 onto a TEMPAX Float glass substrate by spin coating in place of the 6-inch silicon wafer.

Composition of the compositions are shown in Table 3, and evaluation results of photosensitive properties and cured film properties are shown in Table 5.

Examples 2 to 25, Comparative Examples 1 to 3

Compositions 2 to 28 having the composition shown in Tables 3, 4 were prepared in the same manner as in the composition 1. Using the resulting compositions, cured films were prepared in the same manner as in Example 1. The results of evaluation are shown in Tables 5 and 6.

TABLE 3

| | | Additive amount of polysiloxane containing metal compound particles solution | Additive amount of naphthoquinone diazide compound (Part by weight of solid content with respect to 100 of polysiloxane containing metal compound particles) | Other additives | Additive amount of solvent |
|---|---|---|---|---|---|
| Example 1 | Composition 1 | PS-1: 69.49 g | naphthoquinone diazide compound (QD-1): 2.06 g (9 parts by weight) | DFX-18: 30 ppm | DAA: 13.44 g PGMEA: 14.70 g |
| Example 2 | Composition 2 | PS-2: 69.49 g | naphthoquinone diazide compound (QD-1): 2.06 g (9 parts by weight) | DFX-18: 30 ppm | DAA: 13.44 g PGMEA: 14.70 g |
| Example 3 | Composition 3 | PS-3: 69.49 g | naphthoquinone diazide compound (QD-1): 2.06 g (9 parts by weight) | DFX-18: 30 ppm | DAA: 13.44 g PGMEA: 14.70 g |
| Example 4 | Composition 4 | PS-4: 69.49 g | naphthoquinone diazide compound (QD-1): 2.06 g (9 parts by weight) | DFX-18: 30 ppm | DAA: 13.44 g PGMEA: 14.70 g |
| Example 5 | Composition 5 | PS-5: 69.49 g | naphthoquinone diazide compound (QD-1): 2.06 g (9 parts by weight) | DFX-18: 30 ppm | DAA: 13.44 g PGMEA: 14.70 g |
| Example 6 | Composition 6 | PS-6: 69.49 g | naphthoquinone diazide compound (QD-1): 2.06 g (9 parts by weight) | DFX-18: 30 ppm | DAA: 13.44 g PGMEA: 14.70 g |
| Example 7 | Composition 7 | PS-7: 69.49 g | naphthoquinone diazide compound (QD-1): 2.06 g (9 parts by weight) | DFX-18: 30 ppm | DAA: 13.44 g PGMEA: 14.70 g |
| Example 8 | Composition 8 | PS-8: 69.49 g | naphthoquinone diazide compound (QD-1): 2.06 g (9 parts by weight) | DFX-18: 30 ppm | DAA: 13.44 g PGMEA: 14.70 g |
| Example 9 | Composition 9 | PS-9: 69.49 g | naphthoquinone diazide compound (QD-1): 2.06 g (9 parts by weight) | DFX-18: 30 ppm | DAA: 13.44 g PGMEA: 14.70 g |
| Example 10 | Composition 10 | PS-10: 69.49 g | naphthoquinone diazide compound (QD-1): 2.06 g (9 parts by weight) | DFX-18: 30 ppm | DAA: 13.44 g PGMEA: 14.70 g |
| Example 11 | Composition 11 | PS-11: 69.49 g | naphthoquinone diazide compound (QD-1): 2.06 g (9 parts by weight) | DFX-18: 30 ppm | DAA: 13.44 g PGMEA: 14.70 g |
| Example 12 | Composition 12 | PS-12: 69.49 g | naphthoquinone diazide compound (QD-1): 2.06 g (9 parts by weight) | DFX-18: 30 ppm | DAA: 13.44 g PGMEA: 14.70 g |

TABLE 3-continued

| | | Additive amount of polysiloxane containing metal compound particles solution | Additive amount of naphthoquinone diazide compound (Part by weight of solid content with respect to 100 of polysiloxane containing metal compound particles) | Other additives | Additive amount of solvent |
|---|---|---|---|---|---|
| Example 13 | Composition 13 | PS-13: 69.49 g | naphthoquinone diazide compound (QD-1): 2.06 g (9 parts by weight) | DFX-18: 30 ppm | DAA: 13.44 g PGMEA: 14.70 g |
| Example 14 | Composition 14 | PS-14: 69.49 g | naphthoquinone diazide compound (QD-1): 2.06 g (9 parts by weight) | DFX-18: 30 ppm | DAA: 13.44 g PGMEA: 14.70 g |

TABLE 4

| | | Additive amount of polysiloxane containing metal compound particles solution | Additive amount of naphthoquinone diazide compound (Part by weight of solid content with respect to 100 of polysiloxane containing metal compound particles) | Other additives | Additive amount of solvent |
|---|---|---|---|---|---|
| Example 15 | Composition 15 | PS-15: 69.49 g | naphthoquinone diazide compound (QD-1): 2.06 g (9 parts by weight) | DFX-18: 30 ppm | DAA: 13.44 g PGMEA: 14.70 g |
| Example 16 | Composition 16 | PS-16: 69.49 g | naphthoquinone diazide compound (QD-1): 2.06 g (9 parts by weight) | DFX-18: 30 ppm | DAA: 13.44 g PGMEA: 14.70 g |
| Example 17 | Composition 17 | PS-17: 69.49 g | naphthoquinone diazide compound (QD-1): 2.06 g (9 parts by weight) | DFX-18: 30 ppm | DAA: 13.44 g PGMEA: 14.70 g |
| Example 18 | Composition 18 | PS-18: 69.49 g | naphthoquinone diazide compound (QD-1): 2.06 g (9 parts by weight) | DFX-18: 30 ppm | DAA: 13.44 g PGMEA: 14.70 g |
| Example 19 | Composition 19 | PS-6: 72.84 g | naphthoquinone diazide compound (QD-1): 0.96 g (4 parts by weight) | DFX-18: 30 ppm | DAA: 11.28 g PGMEA: 14.72 g |
| Example 20 | Composition 20 | PS-6: 65.87 g | naphthoquinone diazide compound (QD-1): 3.26 g (15 parts by weight) | DFX-18: 30 ppm | DAA: 15.79 g PGMEA: 14.68 g |
| Example 21 | Composition 21 | PS-6: 60.60 g | naphthoquinone diazide compound (QD-1): 5.00 g (25 parts by weight) | DFX-18: 30 ppm | DAA: 19.20 g PGMEA: 14.65 g |
| Example 22 | Composition 22 | PS-6: 69.49 g | naphthoquinone diazide compound (QD-1): 0.92 g (4 parts by weight) naphthoquinone diazide compound (QD-2): 1.15 g (5 parts by weight) | DFX-18: 30 ppm | DAA: 13.44 g PGMEA: 14.70 g |
| Example 23 | Composition 23 | PS-16: 69.49 g | naphthoquinone diazide compound (QD-1): 0.92 g (4 parts by weight) naphthoquinone diazide compound (QD-2): 1.15 g (5 parts by weight) | DFX-18: 30 ppm | DAA: 13.44 g PGMEA: 14.70 g |
| Example 24 | Composition 24 | PS-6: 69.49 g | naphthoquinone diazide compound (QD-2): 2.06 g (9 parts by weight) | DFX-18: 30 ppm | DAA: 13.44 g PGMEA: 14.70 g |
| Example 25 | Composition 25 | PS-16: 69.49 g | naphthoquinone diazide compound (QD-2): 2.06 g (9 parts by weight) | DFX-18: 30 ppm | DAA: 13.44 g PGMEA: 14.70 g |
| Comparative example 1 | Composition 26 | PS-19: 69.49 g | naphthoquinone diazide compound (QD-1): 2.06 g (9 parts by weight) | DFX-18: 30 ppm | DAA: 13.44 g PGMEA: 14.70 g |
| Comparative example 2 | Composition 27 | PS-20: 69.49 g | naphthoquinone diazide compound (QD-1): 2.06 g (9 parts by weight) | DFX-18: 30 ppm | DAA: 13.44 g PGMEA: 14.70 g |
| Comparative example 3 | Composition 28 | PS-21: 69.49 g | naphthoquinone diazide compound (QD-1): 2.06 g (9 parts by weight) | DFX-18: 30 ppm | DAA: 13.44 g PGMEA: 14.70 g |

TABLE 5

| | | | | Photosensitive properties | | | |
|---|---|---|---|---|---|---|---|
| | | | | Immediately after composition preparation | | 1-month storage after composition preparation | |
| | Composition | Thickness of prebaked film (μm) | Normalized remaining film thickness (%) | Photosensitivity (J/m$^2$) | Resolution after development (μm) | Photosensitivity (J/m$^2$) | Resolution after development (μm) |
| Example 1 | Composition 1 | 1.0 | 97 | 900 | 3 | 900 | 3 |
| Example 2 | Composition 2 | 1.0 | 97 | 900 | 3 | 900 | 3 |
| Example 3 | Composition 3 | 1.0 | 98 | 850 | 3 | 850 | 3 |
| Example 4 | Composition 4 | 1.0 | 98 | 800 | 3 | 800 | 3 |
| Example 5 | Composition 5 | 1.0 | 99 | 900 | 3 | 900 | 3 |
| Example 6 | Composition 6 | 1.0 | 98 | 700 | 3 | 700 | 3 |
| Example 7 | Composition 7 | 1.0 | 98 | 600 | 3 | 600 | 3 |
| Example 8 | Composition 8 | 1.0 | 98 | 750 | 2 | 750 | 2 |

TABLE 5-continued

| | | | | | | | |
|---|---|---|---|---|---|---|---|
| Example 9 | Composition 9 | 1.0 | 98 | 700 | 3 | 700 | 3 |
| Example 10 | Composition 10 | 1.0 | 98 | 500 | 5 | 500 | 5 |
| Example 11 | Composition 11 | 1.0 | 98 | 650 | 3 | 650 | 3 |
| Example 12 | Composition 12 | 1.0 | 98 | 700 | 3 | 700 | 3 |
| Example 13 | Composition 13 | 1.0 | 98 | 700 | 3 | 700 | 3 |
| Example 14 | Composition 14 | 1.0 | 98 | 700 | 3 | 700 | 3 |

| | Cured film properties | | | | |
|---|---|---|---|---|---|
| | Thickness of cured film ($\mu$m) | Resolution after curing ($\mu$m) | Refractive index (550 nm) | Light transmittance (%) [1 $\mu$m equivalent basis] | Solvent resistance |
| Example 1 | 0.96 | 3 | 1.75 | 96 | good |
| Example 2 | 0.96 | 3 | 1.75 | 96 | good |
| Example 3 | 0.97 | 3 | 1.75 | 96 | good |
| Example 4 | 0.97 | 3 | 1.75 | 96 | good |
| Example 5 | 0.98 | 3 | 1.75 | 96 | good |
| Example 6 | 0.97 | 3 | 1.75 | 96 | good |
| Example 7 | 0.97 | 3 | 1.75 | 95 | good |
| Example 8 | 0.97 | 2 | 1.73 | 96 | good |
| Example 9 | 0.97 | 3 | 1.75 | 96 | good |
| Example 10 | 0.97 | 5 | 1.76 | 95 | good |
| Example 11 | 0.97 | 3 | 1.70 | 95 | good |
| Example 12 | 0.97 | 3 | 1.86 | 96 | good |
| Example 13 | 0.97 | 3 | 1.95 | 95 | good |
| Example 14 | 0.97 | 3 | 1.76 | 96 | good |

TABLE 6

| | | | Photosensitive properties | | | |
|---|---|---|---|---|---|---|
| | | | | Immediately after composition preparation | 1-month storage after composition preparation | |
| | Composition | Thickness of prebaked film ($\mu$m) | Normalized remaining film thickness (%) | Photosensitivity (J/m$^2$) | Resolution after development ($\mu$m) | Photosensitivity (J/m$^2$) | Resolution after development ($\mu$m) |
| Example 15 | Composition 15 | 1.0 | 98 | 700 | 3 | 700 | 3 |
| Example 16 | Composition 16 | 1.0 | 98 | 700 | 3 | 700 | 3 |
| Example 17 | Composition 17 | 1.0 | 98 | 700 | 3 | 700 | 3 |
| Example 18 | Composition 18 | 1.0 | 98 | 650 | 3 | 650 | 3 |
| Example 19 | Composition 19 | 1.0 | 96 | 950 | 3 | 950 | 3 |
| Example 20 | Composition 20 | 1.0 | 98 | 600 | 3 | 600 | 3 |
| Example 21 | Composition 21 | 1.0 | 98 | 500 | 3 | 500 | 3 |
| Example 22 | Composition 22 | 1.0 | 98 | 700 | 3 | 700 | 3 |
| Example 23 | Composition 23 | 1.0 | 98 | 700 | 3 | 700 | 3 |
| Example 24 | Composition 24 | 1.0 | 98 | 800 | 3 | 800 | 3 |
| Example 25 | Composition 25 | 1.0 | 98 | 850 | 3 | 850 | 3 |
| Comparative example 1 | Composition 26 | 1 | 95 | 2000 | 10 | >4000 | >50 |

TABLE 6-continued

| | | | | | | | |
|---|---|---|---|---|---|---|---|
| Comparative example 2 | Composition 27 | 1 | 96 | 800 | 5 | >3000 | >50 |
| Comparative example 3 | Composition 28 | 1 | 92 | 700 | 4 | >3000 | >50 |

| | | Cured film properties | | | | |
|---|---|---|---|---|---|---|
| | | Thickness of cured film (μm) | Resolution after curing (μm) | Refractive index (550 nm) | Light transmittance (%) [1 μm equivalent basis] | Solvent resistance |
| | Example 15 | 0.97 | 3 | 1.77 | 96 | good |
| | Example 16 | 0.97 | 3 | 1.79 | 96 | good |
| | Example 17 | 0.97 | 3 | 1.81 | 96 | good |
| | Example 18 | 0.97 | 3 | 1.76 | 96 | good |
| | Example 19 | 0.96 | 3 | 1.76 | 96 | good |
| | Example 20 | 0.96 | 3 | 1.75 | 96 | good |
| | Example 21 | 0.96 | 3 | 1.74 | 96 | good |
| | Example 22 | 0.97 | 3 | 1.76 | 97 | good |
| | Example 23 | 0.97 | 3 | 1.79 | 97 | good |
| | Example 24 | 0.97 | 3 | 1.76 | 97 | good |
| | Example 25 | 0.97 | 3 | 1.79 | 97 | good |
| | Comparative example 1 | 0.855 | 10 | 1.75 | 97 | bad |
| | Comparative example 2 | 0.864 | 5 | 1.53 | 97 | good |
| | Comparative example 3 | 0.874 | 4 | 1.53 | 97 | good |

The invention claimed is:

1. A positive photosensitive resin composition comprising: (a') a polysiloxane containing metal compound-containing particles synthesised by hydrolysing and partially condensing an organosilane represented by the following general formula (1) and an organosilane that has a carboxyl group and/or a dicarboxylic acid anhydride structure in the presence of particles, wherein the particles consist of particles of one or more metal compounds selected from among an aluminium compound, a tin compound, a titanium compound and a zirconium compound, or composite particles of a silicon compound and one or more metal compounds selected from among an aluminium compound, a tin compound, a titanium compound and a zirconium compound; (b) a naphthoquinone diazide compound; and (c) a solvent:

[Chemical Formula 1]

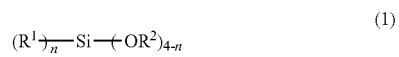
(1)

wherein $R^1$ represents hydrogen, an alkyl group with a carbon number of 1 to 10, an alkenyl group with a carbon number of 2 to 10 or an aryl group with a carbon number of 6 to 16, $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^2$s may be the same or different, respectively, wherein the content of the particles of one or more metal compounds selected from among an aluminium compound, a tin compound, a titanium compound and a zirconium compound, or the content of the composite particles of a silicon compound and one or more metal compounds selected from among an aluminium compound, a tin compound, a titanium compound and a zirconium compound, is more than 250 parts by weight and 500 parts by weight or less with respect to 100 parts by weight of the total amount of the organosilane represented by the general formula (1) and the organosilane having a carboxyl group and/or a dicarboxylic acid anhydride structure.

2. The positive photosensitive resin composition according to claim 1, wherein $R^1$ of the organosilane represented by the general formula (1) contains a condensed polycyclic aromatic hydrocarbon group.

3. The positive photosensitive resin composition according to claim 2, wherein the content of an organosilane, in which $R^1$ contains a condensed polycyclic aromatic hydrocarbon group, in the organosilane represented by the general formula (1), is 10 mol % or more in terms of the molar ratio of Si atoms of the organosilane to the mole number of Si atoms of a whole polysiloxane derived from an organosilane.

4. The positive photosensitive resin composition according to claim 1, wherein the organosilane having a carboxyl group and/or a dicarboxylic acid anhydride structure is a dicarboxylic acid anhydride represented by any one of the following general formulas (2) to (4):

[Chemical Formula 3]

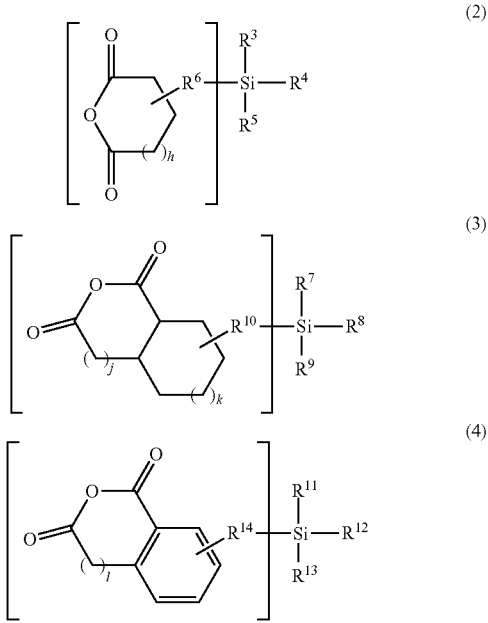

wherein $R^3$ to $R^5$, $R^7$ to $R^9$, and $R^{11}$ to $R^{13}$ represent an alkyl group with a carbon number of 1 to 6, an alkoxy group with a carbon number of 1 to 6, a phenyl group, a phenoxy group, or an alkylcarbonyloxy group with a carbon number of 2 to 6, $R^6$, $R^{10}$ and $R^{14}$ represent a chain aliphatic hydrocarbon group of a single bond or with a carbon number of 1 to 10, a cyclic aliphatic hydrocarbon group with a carbon number of 3 to 16, an alkylcarbonyloxy group with a carbon number of 2 to 6, a carbonyl group, an ether group, an ester group, an amide group, an aromatic group with a carbon number of 6 to 16, or a divalent group having at least one of these, wherein for a hydrogen atom of $R^6$, $R^{10}$ or $R^{14}$ an alkyl group with a carbon number of 1 to 10, an alkenyl group with a carbon number of 2 to 10, an aryl group with a carbon number of 6 to 16, an alkylcarbonyloxy group with a carbon number of 2 to 6, a hydroxy group, an amino group, a carboxyl group or a thiol group may be substituted, and wherein h, j, k and i represent an integer of 0 to 3.

5. The positive photosensitive resin composition according to claim 1, wherein the content ratio of the organosilane having a carboxyl group and/or a dicarboxylic acid anhydride structure is 5 mol % or more and 30 mol % or less in terms of the molar ratio of Si atoms of the organosilane to the mole number of Si atoms of a whole polysiloxane derived from an organosilane.

6. The positive photosensitive resin composition according to claim 1, wherein a number average particle size of the particles of one or more metal compounds selected from among an aluminium compound, a tin compound, a titanium compound and a zirconium compound, or a number average particle size of the composite particles of a silicon compound and one or more metal compounds selected from among an aluminium compound, a tin compound, a titanium compound and a zirconium compound, is 1 nm to 200 nm.

7. The positive photosensitive resin composition according to claim 1, wherein the particles are particles of a titanium compound, particles of a zirconium compound, or composite particles of a silicon compound and a titanium compound or a zirconium compound.

8. A cured film formed by curing the positive photosensitive resin composition according to claim 1.

9. An optical device comprising the cured film according to claim 8.

10. A positive photosensitive resin composition comprising: (a') a polysiloxane containing metal compound-containing particles synthesised by hydrolysing and partially condensing an organosilane represented by the following general formula (1) and an organosilane that has a carboxyl group and/or a dicarboxylic acid anhydride structure in the presence of particles of one or more metal compounds selected from among an aluminium compound, a tin compound, a titanium compound and a zirconium compound, or in the presence of composite particles of a silicon compound and one or more metal compounds selected from among an aluminium compound, a tin compound, a titanium compound and a zirconium compound; (b) a naphthoquinone diazide compound; and (c) a solvent, wherein the positive photosensitive resin provides a cured film having a refractive index of 1.65 to 2.00:

[Chemical Formula 2]

wherein $R^1$ represents hydrogen, an alkyl group with a carbon number of 1 to 10, an alkenyl group with a carbon number of 2 to 10 or an aryl group with a carbon number of 6 to 16, $R^2$ represents hydrogen, an alkyl group with a carbon number of 1 to 6, an acyl group with a carbon number of 2 to 6 or an aryl group with a carbon number of 6 to 16, n represents an integer of 0 to 3, and when n is 2 or more, $R^1$s may be the same or different, respectively, and when n is 2 or less, $R^2$s may be the same or different, respectively, wherein the content of the particles of one or more metal compounds selected from among an aluminium compound, a tin compound, a titanium compound and a zirconium compound, or the content of the composite particles of a silicon compound and one or more metal compounds selected from among an aluminium compound, a tin compound, a titanium compound and a zirconium compound, is more than 250 parts by weight and 500 parts by weight or less with respect to 100 parts by weight of the total amount of the organosilane represented by the general formula (1) and the organosilane having a carboxyl group and/or a dicarboxylic acid anhydride structure.

* * * * *